US010297222B2

(12) United States Patent
Morita

(10) Patent No.: US 10,297,222 B2
(45) Date of Patent: *May 21, 2019

(54) DRIVER AND ELECTRONIC DEVICE FOR SUPPRESSING A RISE OR FALL IN VOLTAGE AT AN OUTPUT TERMINAL IN CAPACITIVE DRIVING

(71) Applicant: SEIKO EPSON CORPORATION, Tokyo (JP)

(72) Inventor: Akira Morita, Chino (JP)

(73) Assignee: SEIKO EPSON CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/936,815

(22) Filed: Mar. 27, 2018

(65) Prior Publication Data

US 2018/0218704 A1 Aug. 2, 2018

Related U.S. Application Data

(63) Continuation of application No. 14/954,025, filed on Nov. 30, 2015, now Pat. No. 9,959,833.

(30) Foreign Application Priority Data

Dec. 5, 2014 (JP) ................. 2014-246532

(51) Int. Cl.
*G09G 3/36* (2006.01)
*H03M 1/08* (2006.01)
(Continued)

(52) U.S. Cl.
CPC ........ *G09G 3/3688* (2013.01); *H03M 1/0863* (2013.01); *G09G 3/20* (2013.01);
(Continued)

(58) Field of Classification Search
CPC ...... G09G 3/3685; G09G 3/3688; G09G 3/20; H03M 1/70; H03M 1/0863
(Continued)

(56) References Cited

U.S. PATENT DOCUMENTS 5,332,997 A * 7/1994 Dingwall ............. G09G 3/2011
341/136
6,101,102 A 8/2000 Brand et al.
(Continued)

FOREIGN PATENT DOCUMENTS

CN 1197250 C 4/2005
JP H5-145421 A 6/1993
(Continued)

OTHER PUBLICATIONS

Dec. 7, 2016 Office Action issued in U.S. Appl. No. 14/870,555.
(Continued)

*Primary Examiner* — Adam J Snyder
(74) *Attorney, Agent, or Firm* — Oliff PLC

(57) ABSTRACT

A driver and an electronic device include a capacitor driving circuit and a capacitor circuit having a plurality of capacitors provided between a plurality of capacitor driving nodes and a data voltage output terminal. The capacitor driving circuit has a plurality of driving units that output capacitor driving voltages, and in the case where a capacitance of one of the plurality of capacitors is the highest, after a driving unit that drives that capacitor has outputted a capacitor driving voltage, the next driving unit outputs the next capacitor driving voltage.

14 Claims, 23 Drawing Sheets

(51) Int. Cl.
  *G09G 3/20* (2006.01)
  *H03M 1/70* (2006.01)
(52) U.S. Cl.
  CPC ............. *G09G 2310/027* (2013.01); *G09G 2310/0251* (2013.01); *G09G 2310/0297* (2013.01); *G09G 2330/06* (2013.01); *H03M 1/70* (2013.01)
(58) Field of Classification Search
  USPC ........................................................ 345/89
  See application file for complete search history.

(56) References Cited

U.S. PATENT DOCUMENTS

| | | | |
|---|---|---|---|
| 6,307,681 B1 | 10/2001 | Aoki et al. | |
| 6,420,988 B1 | 7/2002 | Azami et al. | |
| 6,486,812 B1 | 11/2002 | Tanaka | |
| 6,496,131 B2 | 12/2002 | Yoshinaga | |
| 6,606,045 B2 | 8/2003 | Azami et al. | |
| 7,436,385 B2 | 10/2008 | Kim et al. | |
| 7,683,871 B2 | 3/2010 | Kato | |
| 8,400,439 B2 | 3/2013 | Morita | |
| 8,780,103 B2 | 7/2014 | van Veenendaal et al. | |
| 9,697,762 B2* | 7/2017 | Morita | G09G 3/2092 |
| 9,959,833 B2* | 5/2018 | Morita | G09G 3/3688 |
| 2002/0036580 A1 | 3/2002 | Yoshinaga | |
| 2002/0041245 A1 | 4/2002 | Brownlow et al. | |
| 2002/0060636 A1 | 5/2002 | Kazuhiro et al. | |
| 2002/0186157 A1 | 12/2002 | Tanaka | |
| 2005/0168416 A1 | 8/2005 | Hashimoto et al. | |
| 2005/0206598 A1 | 9/2005 | Yamazaki et al. | |
| 2006/0192793 A1 | 8/2006 | Kato | |
| 2007/0052566 A1* | 3/2007 | Sutardja | H03M 1/682 341/144 |
| 2009/0066615 A1 | 3/2009 | Kawasaki | |
| 2010/0039303 A1* | 2/2010 | Tsukamoto | H03M 1/1061 341/150 |
| 2011/0148680 A1 | 6/2011 | Kuramochi | |
| 2011/0205481 A1 | 8/2011 | Aruga et al. | |
| 2015/0049073 A1 | 2/2015 | Morita | |

FOREIGN PATENT DOCUMENTS

| | | |
|---|---|---|
| JP | 2000-341125 A | 12/2000 |
| JP | 2001-156641 A | 6/2001 |
| JP | 2002-094381 A | 3/2002 |
| JP | 2002-100991 A | 4/2002 |
| JP | 2006-243061 A | 9/2006 |
| JP | 2007-028662 A | 2/2007 |
| JP | 2010-102080 A | 5/2010 |
| JP | 2010-181506 A | 8/2010 |
| JP | 2011-130440 A | 6/2011 |
| JP | 2015-036757 A | 2/2015 |
| JP | 2015-038543 A | 2/2015 |

OTHER PUBLICATIONS

Apr. 20, 2017 Office Action issued in U.S. Appl. No. 14/876,377.
Mar. 10, 2017 Office Action issued in U.S. Appl. No. 14/925,321.
Jul. 18, 2017 Office Action issued in U.S. Appl. No. 14/954,025.
Aug. 25, 2017 Office Action issued in U.S. Appl. No. 14/925,321.

* cited by examiner

| | BUFFER DRIVING CAPABILITY 1 | | |
|---|---|---|---|
| | Pch | Nch | D/C |
| CAPACITOR | CAPACITANCE [pF] | W[um] | W[um] | NchW [um]/ CAPACITANCE [pF] |
| C10 | 32 | 600 | 200 | 6.25 |
| C9 | 16 | 300 | 100 | 6.25 |
| C8 | 8 | 150 | 50 | 6.25 |
| C7 | 4 | 75 | 25 | 6.25 |
| C6 | 2 | 37.5 | 12.5 | 6.25 |
| C5 | 1 | 20 | 6.25 | 6.25 |
| C4 | 0.5 | 18 | 6 | 12 |
| C3 | 0.25 | 18 | 6 | 24 |
| C2 | 0.125 | 18 | 6 | 48 |
| C1 | 0.0625 | 18 | 6 | 96 |

FIG. 13B

| | BUFFER DRIVING CAPABILITY 2 | | |
|---|---|---|---|
| | Pch | Nch | D/C |
| CAPACITOR | CAPACITANCE [pF] | W[um] | W[um] | NchW [um]/ CAPACITANCE [pF] |
| C10 | 32 | 300 | 100 | 3.125 |
| C9 | 16 | 150 | 50 | 3.125 |
| C8 | 8 | 75 | 25 | 3.125 |
| C7 | 4 | 75 | 25 | 6.25 |
| C6 | 2 | 37.5 | 12.5 | 6.25 |
| C5 | 1 | 20 | 6.25 | 6.25 |
| C4 | 0.5 | 18 | 6 | 12 |
| C3 | 0.25 | 18 | 6 | 24 |
| C2 | 0.125 | 18 | 6 | 48 |
| C1 | 0.0625 | 18 | 6 | 96 |

FIG. 14A RESET
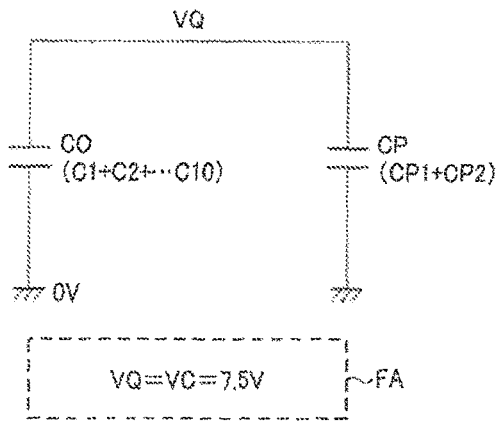
FIG. 14B MAXIMUM DATA VOLTAGE
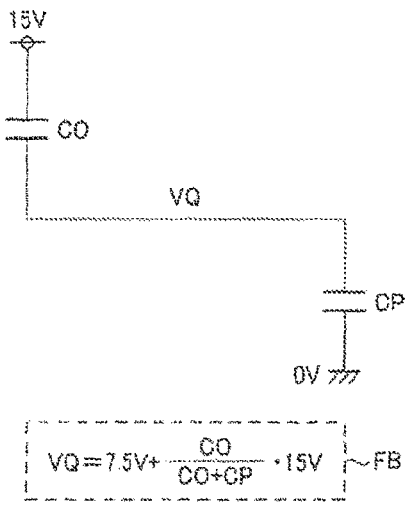
FIG. 14C
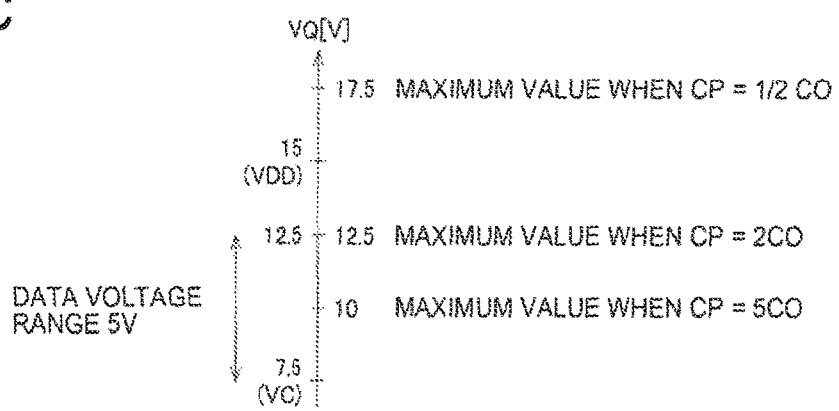

FIG. 16A RESET
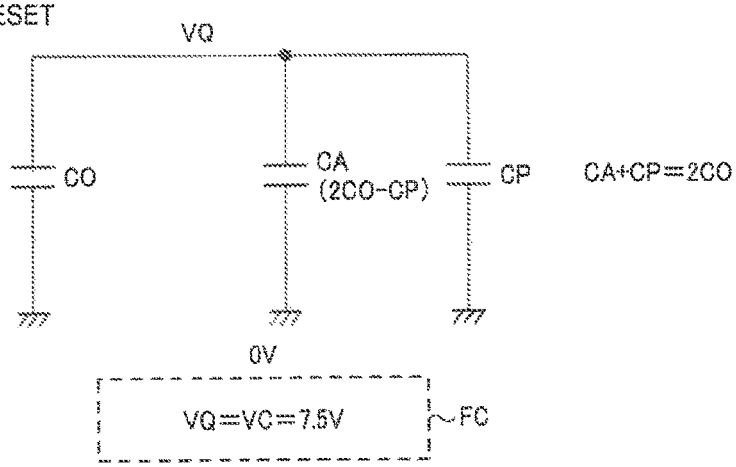
FIG. 16B MAXIMUM DATA VOLTAGE
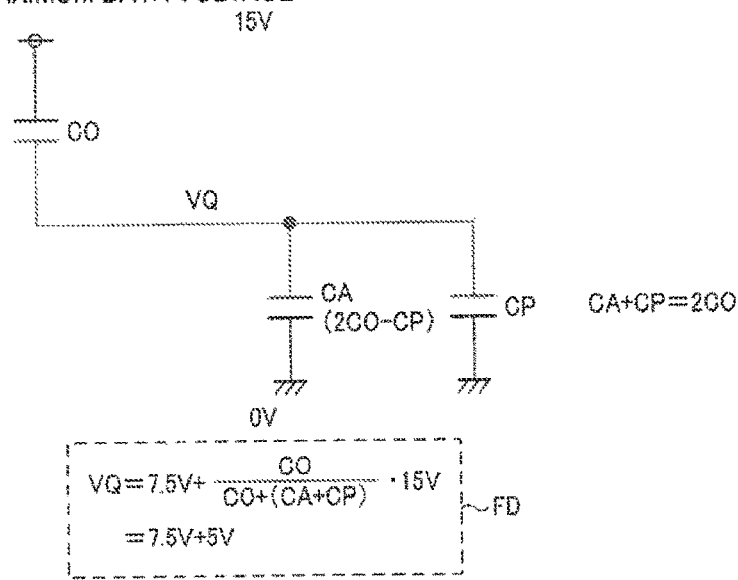
FIG. 16C
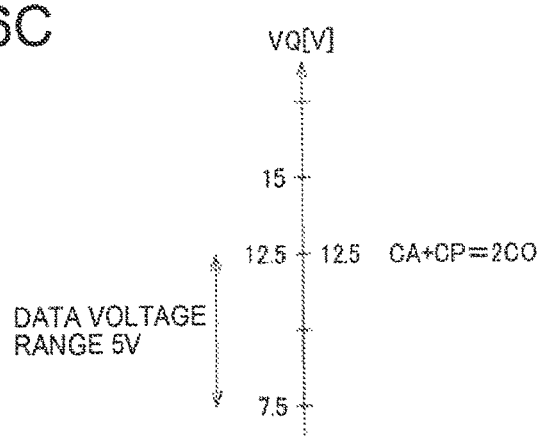

FIG. 20A (S8:NO)
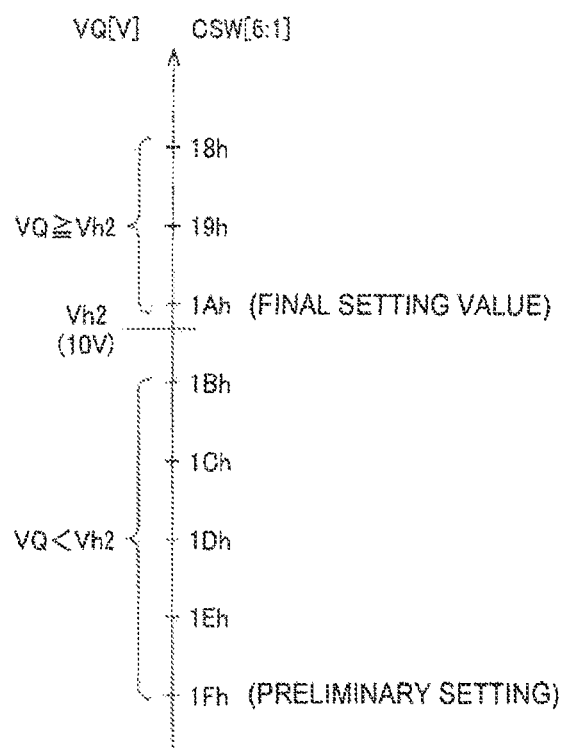
FIG. 20B (S8:YES)
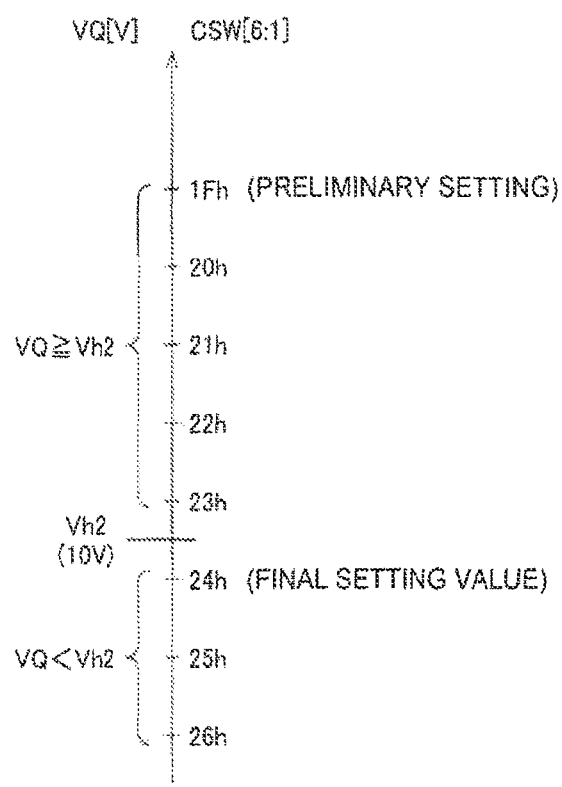

DRIVER AND ELECTRONIC DEVICE FOR SUPPRESSING A RISE OR FALL IN VOLTAGE AT AN OUTPUT TERMINAL IN CAPACITIVE DRIVING

This application is a Continuation of application Ser. No. 14/954,025, filed on Nov. 30, 2015, and claims the benefits of Japanese Patent Application No. 2014-246532, filed Dec. 5, 2014. The entire contents of the prior applications are hereby incorporated by reference herein in their entirety.

BACKGROUND

1. Technical Field

The present invention relates to drivers, electronic devices, and the like.

2. Related Art

Display devices (liquid-crystal display devices, for example) are used in a variety of electronic devices, including projectors, information processing apparatuses, mobile information terminals, and the like. Increases in the resolutions of such display devices continue to progress, and as a result, the time a driver drives a single pixel is becoming shorter. For example, phase expansion driving is used as a method for driving an electro-optical panel (a liquid-crystal display panel, for example). According to this driving method, for example, eight source lines are driven at one time, and the process is repeated 160 times to drive 1,280 source lines. In the case where a WXGA (1,280×768 pixels) panel is to be driven, the stated 160 instances of driving (that is, the driving of a single horizontal scanning line) is thus repeated 768 times. Assuming a refresh rate of 60 Hz, a simple calculation shows that the driving time for a single pixel is approximately 135 nanoseconds. In actuality, there are periods where pixels are not driven (blanking intervals and the like, for example), and thus the driving time for a single pixel becomes even shorter, at approximately 70 nanoseconds.

With the shortening of pixel driving times as mentioned above, it is becoming difficult for amplifier circuits to finish writing data voltages within the required time. A method that drives an electro-optical panel through capacitor charge redistribution (called "capacitive driving" hereinafter) can be considered as a driving method for solving such problems. For example, JP-A-2000-341125 and JP-A-2001-156641 disclose techniques that use capacitor charge redistribution in D/A conversion. In a D/A conversion circuit, both driving-side capacitance and load-side capacitance are included in an IC, and charge redistribution occurs between those capacitances. For example, assume such a load-side capacitance of the D/A conversion circuit is replaced with the capacitance of the electro-optical panel external to the IC and the D/A conversion circuit is used as a driver. In this case, charge redistribution occurs between the driver-side capacitance and the electro-optical panel-side capacitance.

However, there is a problem in that a resistance of an input terminal of the electro-optical panel (a resistance for electrostatic protection, for example) interferes with the movement of charges, resulting in a voltage at an output terminal of the driver temporarily rising above (or falling below) a desired data voltage. In the case where this voltage rise (or fall) exceeds (or falls below) a power source voltage, for example, the charge will escape to the power source via an electrostatic protection element of the driver (a diode provided between the output terminal and the power source, for example), and the charge in the charge redistribution will no longer be conserved. When this occurs, the desired data voltage can no longer be obtained. Alternatively, the rise (or fall) in the voltage will exceed the breakdown voltage of a transistor or the like, which may cause the driver to malfunction.

SUMMARY

An advantage of some aspects of the invention is to provide a driver, an electronic device, and so on capable of suppressing a rise (or fall) in a voltage at an output terminal in capacitive driving.

An aspect of the invention relates to a driver including a capacitor driving circuit that outputs first to nth capacitor driving voltages (where n is a natural number of 2 or more) corresponding to tone data to first to nth capacitor driving nodes, and a capacitor circuit including first to nth capacitors provided between the first to nth capacitor driving nodes and a data voltage output terminal. The capacitor driving circuit includes first to nth driving units that output the first to nth capacitor driving voltages; and in the case where a capacitance of the nth capacitor of the first to nth capacitors is the highest, an n−1th driving unit of the first to nth driving units outputs an n−1th capacitor driving voltage of the first to nth capacitor driving voltages after the nth driving unit among the first to nth driving units has outputted the nth capacitor driving voltage.

According to this aspect of the invention, the n−1th driving unit that drives the n−1th capacitor outputs the n−1th capacitor driving voltage after the nth driving unit, which drives the nth capacitor whose capacitance is highest, has outputted the nth capacitor driving voltage. By carrying out driving in this manner, the supply of a charge from the n−1th capacitor to the data voltage output terminal is started after the supply of a charge from the nth capacitor, whose capacitance is the highest, to the data voltage output terminal has started. Through this, a rise (or fall) in a voltage at an output terminal in capacitive driving can be suppressed.

According to another aspect of the invention, in the case where a capacitance of an ith capacitor (where i is a natural number, with 1≤i≤n) of the first to nth capacitors is greater than a capacitance of a jth capacitor (where j is a natural number, with j<i and 1≤j≤n), a jth driving unit of the first to nth driving units may output a jth capacitor driving voltage of the first to nth capacitor driving voltages after an ith driving unit of the first to nth driving units has outputted an ith capacitor driving voltage of the first to nth capacitor driving voltages.

By doing so, a timing at which the supply of a charge from the ith capacitor to the data voltage output terminal starts and a timing at which the supply of a charge from the jth capacitor to the data voltage output terminal starts are shifted, and thus a rise in the voltage at the data voltage output terminal can be suppressed. In addition, by driving the ith capacitor, which has a higher capacitance, first, capacitive driving can be maintained at a high speed.

According to another aspect of the invention, in the case where a delay time of a signal in the ith driving unit is represented by tdi and a delay time of a signal in the jth driving unit is represented by tdj, tdi may be greater than tdj, and a delay time of a jth input signal inputted into the jth driving unit relative to an ith input signal inputted into the ith driving unit may be greater than tdi−tdj.

A delay time from an ith capacitor driving voltage outputted by the ith driving unit to a jth capacitor driving voltage outputted by the jth driving unit is obtained by subtracting, from a delay time from the ith input signal to the jth input signal, a difference in the delay times in the driving units (tdi−tdj). According to this aspect of the invention, the delay time of the jth input signal relative to the ith input signal is greater than the difference in the delay times in the driving units (tdi−tdj), and thus the jth driving unit can output the jth capacitor driving voltage after the ith driving unit has outputted the ith capacitor driving voltage.

According to another aspect of the invention, the driver may further include a signal output circuit that outputs first to nth input signals to the first to nth driving units, and the signal output circuit may output the first to nth input signals to the first to nth driving units having delayed an n−1th input signal of the first to nth input signals more than an nth input signal of the first to nth input signals.

By doing so, the n−1th input signal inputted into the n−1th driving unit can be delayed relative to the nth input signal inputted into the nth driving unit. Then, by the nth driving unit buffering the nth input signal and the n−1th driving unit buffering the n−1th input signal, the n−1th driving unit can output the n−1th capacitor driving voltage after the nth driving unit has outputted the nth capacitor driving voltage.

According to another aspect of the invention, the driver may further include a signal output circuit that outputs first to nth input signals to the first to nth driving units, and the signal output circuit may output the first to nth input signals to the first to nth driving units having delayed a jth input signal (where j is a natural number, with j<i and 1≤j≤n) of the first to nth input signals more than an ith input signal (where i is a natural number, with 1≤i≤n) of the first to nth input signals.

By doing so, the jth input signal inputted into the jth driving unit can be delayed relative to the ith input signal inputted into the ith driving unit. Then, by the ith driving unit buffering the ith input signal and the jth driving unit buffering the jth input signal, the jth driving unit can output the jth capacitor driving voltage after the ith driving unit has outputted the ith capacitor driving voltage.

According to another aspect of the invention, in the case where driving capabilities of the first to nth driving units are represented by D1 to Dn and capacitances of the first to nth capacitors are represented by C1 to Cn, the driving capability Dn of the nth driving unit may be set so that Dn/Cn<D1/C1.

By setting the driving capability Dn of the nth driving unit so that Dn/Cn<D1/C1, a slope of a change in the nth capacitor driving voltage that drives the nth capacitor, whose charge supply amount to the data voltage output terminal is the highest, can be made lower than a slope of a change in the first capacitor driving voltage that drives the first capacitor. Through this, a rise (or fall) in a voltage at an output terminal in capacitive driving can be suppressed.

According to another aspect of the invention, at least the nth driving unit of the first to nth driving units is a driving unit whose driving capability is variable.

By doing so, the driving capability of the nth driving unit, which drives the nth capacitor whose capacitance is the highest among the first to nth capacitors, can be adjusted in a variable manner. This makes it possible to reduce the driving capability of the nth driving unit that drives the nth capacitor having the highest capacitance, which in turn makes it possible to suppress a rise (or fall) in a voltage at an output terminal in capacitive driving.

According to another aspect of the invention, the driver may further include a variable capacitance circuit provided between the data voltage output terminal and a reference voltage node; and a capacitance of the variable capacitance circuit may be set so that a capacitance obtained by adding a capacitance of the variable capacitance circuit and an electro-optical panel-side capacitance is in a prescribed capacitance ratio relationship with a capacitance of the capacitor circuit.

Accordingly, even if the electro-optical panel-side capacitance is different, the prescribed capacitance ratio relationship can be realized by adjusting the capacitance of the variable capacitance circuit in accordance therewith, and a desired data voltage range that corresponds to that capacitance ratio relationship can be realized. In other words, capacitive driving that is generally applicable in a variety of connection environments (the type of the electro-optical panel connected to the driver, the design of a printed circuit board on which the driver is mounted, and so on, for example) can be realized.

Another aspect of the invention concerns an electronic device including any of the drivers described above.

BRIEF DESCRIPTION OF THE DRAWINGS

The invention will be described with reference to the accompanying drawings, wherein like numbers reference like elements.

FIGS. 13A and 13B illustrate examples of the driving capability of a driving unit according to an embodiment.

FIGS. 14A to 14C are diagrams illustrating data voltages in the first configuration example.

FIGS. 16A to 16C are diagrams illustrating data voltages in the second configuration example.

FIGS. 20A and 20B are diagrams illustrating a process for setting a capacitance of a variable capacitance circuit.

DESCRIPTION OF EXEMPLARY EMBODIMENTS

Hereinafter, preferred embodiments of the invention will be described in detail. Note that the embodiments described hereinafter are not intended to limit the content of the invention as described in the appended claims in any way, and not all of the configurations described in these embodiments are required as the means to solve the problems as described above.

1. First Example of Configuration of Driver

Figure 1:
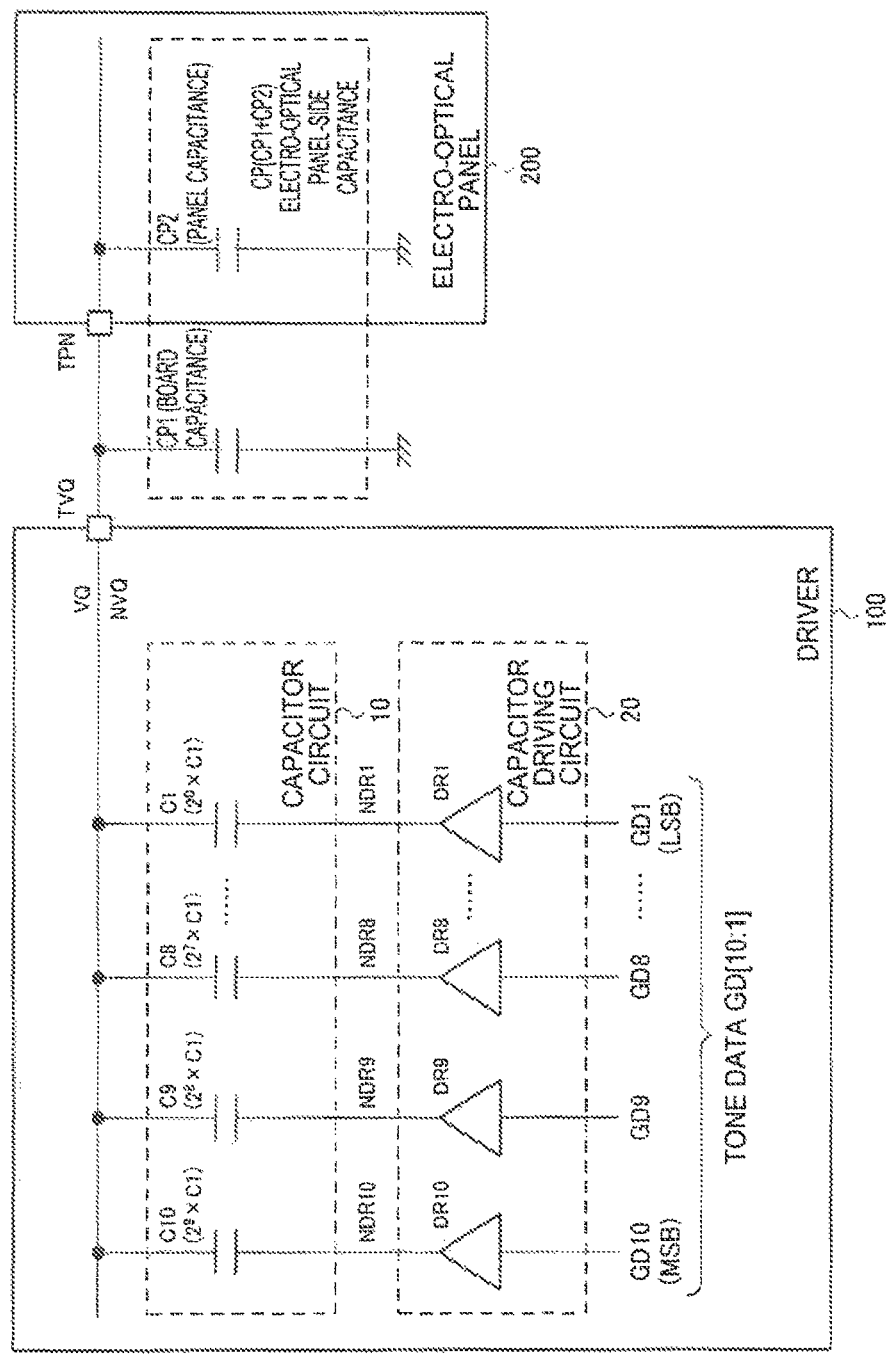
FIG. 1 illustrates a first example of the configuration of a driver.

FIG. 1 illustrates a first example of the configuration of a driver according to this embodiment. This driver 100 includes a capacitor circuit 10, a capacitor driving circuit 20, and a data voltage output terminal TVQ. Note that in the following, the same sign as a sign for a capacitor is used as a sign indicating a capacitance value of that capacitor.

The driver 100 is constituted by an integrated circuit (IC) device, for example. The integrated circuit device corresponds to an IC chip in which a circuit is formed on a silicon substrate, or a device in which an IC chip is held in a package, for example. Terminals of the driver 100 (the data voltage output terminal TVQ and so on) correspond to pads or package terminals of the IC chip.

The capacitor circuit 10 includes first to nth capacitors C1 to Cn (where n is a natural number of 2 or more). The capacitor driving circuit 20 includes first to nth driving units DR1 to DRn. Although the following describes a case where n=10 as an example, n may be any natural number greater than or equal to 2. For example, n may be set to the same number as the bit number of tone data.

One end of an ith capacitor in the capacitors C1 to C10 (where i is a natural number no greater than n, which is 10) is connected to a capacitor driving node NDRi, and another end of the ith capacitor is connected to a data voltage output node NVQ. The data voltage output node NVQ is a node connected to the data voltage output terminal TVQ. The capacitors C1 to C10 have capacitance values weighted by a power of 2. Specifically, the capacitance value of the ith capacitor Ci is $2^{(i-1)} \times C1$.

An ith bit GDi of tone data GD[10:1] is inputted into an input node of an ith driving unit DRi of the first to tenth driving units DR1 to DR10. An output node of the ith driving unit DRi corresponds to the ith capacitor driving node NDRi. The tone data GD[10:1] is constituted of first to tenth bits GD1 to GD10 (first to nth bits), where the bit GD1 corresponds to the LSB and the bit GD10 corresponds to the MSB.

The ith driving unit DRi outputs a first voltage level in the case where the bit GDi is at a first logic level and outputs a second voltage level in the case where the bit GDi is at a second logic level. For example, the first logic level is 0 (low-level), the second logic level is 1 (high-level), the first voltage level is a voltage at a low-potential side power source VSS (0 V, for example), and the second voltage level is a voltage at a high-potential side power source VDD (15 V, for example). For example, the ith driving unit DRi is constituted of a level shifter that level-shifts the inputted logic level (a 3 V logic power source, for example) to the output voltage level (15 V, for example) of the driving unit DRi, a buffer circuit that buffers the output of that level shifter, and so on.

As described above, the capacitance values of the capacitors C1 to C10 are weighted by a power of 2 that is based on the order of the bits GD1 to GD10 in the tone data GD[10:1]. The driving units DR1 to DR10 output 0 V or 15 V in accordance with the bits GD1 to GD10, and the capacitors C1 to C10 are driven by those voltages. As a result of this driving, charge redistribution occurs between the capacitors C1 to C10 and an electro-optical panel-side capacitance CP, and a data voltage is output to the data voltage output terminal TVQ as a result.

The electro-optical panel-side capacitance CP is the sum of capacitances as viewed from the data voltage output terminal TVQ. For example, the electro-optical panel-side capacitance CP is a result of adding a board capacitance CP1 that is parasitic capacitance of a printed circuit board with a panel capacitance CP2 that is parasitic capacitance, pixel capacitances, and the like within an electro-optical panel 200.

Specifically, the driver 100 is mounted on a rigid board as an integrated circuit device, a flexible board is connected to that rigid board, and the electro-optical panel 200 is connected to that flexible board. Interconnects are provided on the rigid board and the flexible board for connecting the data voltage output terminal TVQ of the driver 100 to a data voltage input terminal TPN of the electro-optical panel 200. Parasitic capacitance of these interconnects corresponds to the board capacitance CP1. Meanwhile, as will be described later with reference to FIG. 17, data lines connected to the data voltage input terminal TPN, source lines, switching elements that connect the data lines to the source lines, pixel circuits connected to the source lines, and so on are provided in the electro-optical panel 200. The switching elements are constituted by TFTs (Thin Film Transistors), for example, and there is parasitic capacitance between the source and gate of each switching element. Many switching elements are connected to the data lines, and thus the parasitic capacitance of many switching elements is present on the data lines. Parasitic capacitance is also present between data lines, source lines, or the like and a panel substrate. In the liquid-crystal display panel, there is capacitance in the liquid-crystal pixels. The panel capacitance CP2 is the sum of those capacitances.

The electro-optical panel-side capacitance CP is 50 pF to 120 pF, for example. As will be described later, to ensure a ratio of 1:2 between a capacitance CO of the capacitor circuit 10 (the sum of the capacitances of the capacitors C1 to C10) and the electro-optical panel-side capacitance CP, the capacitance CO of the capacitor circuit 10 is 25 pF to 60 pF. Although large as a capacitance internal to an integrated circuit, the capacitance CO of the capacitor circuit 10 can be achieved by a cross-sectional structure that, for example, vertically stacks two to three levels of MIM (Metal Insulation Metal) capacitors.

2. Data Voltages

Next, data voltages outputted by the driver 100 with respect to the tone data GD[10:1] will be described. Here, it is assumed that the capacitance CO of the capacitor circuit 10 (=C1+C2+ . . . C10) is set to CP/2.

Figure 2A:
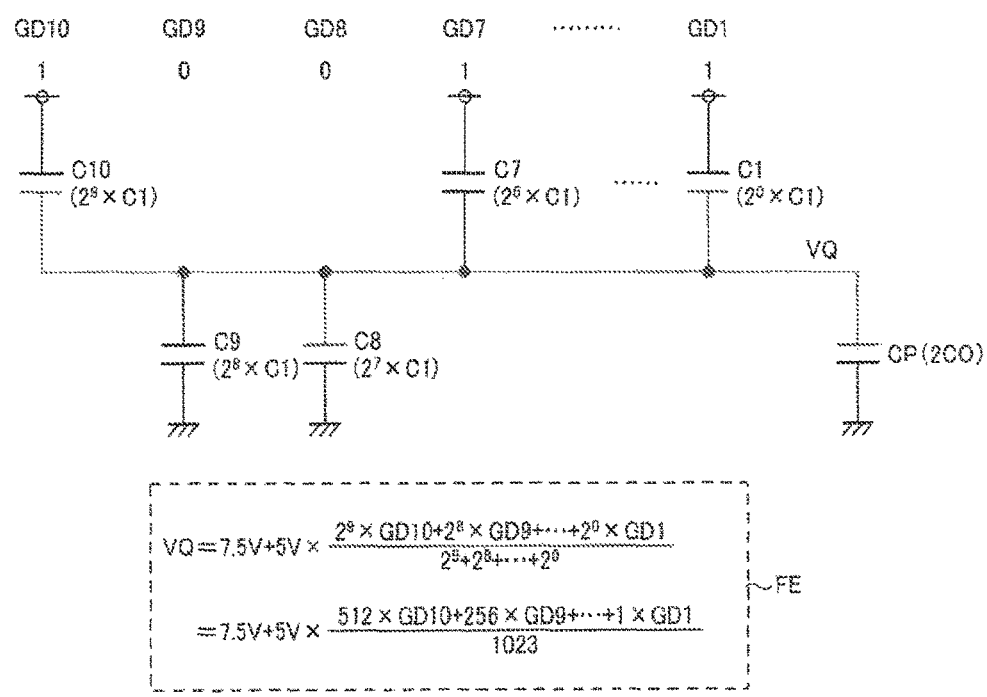
FIGS. 2A and 2B are diagrams illustrating data voltages corresponding to tone data.

As illustrated in FIG. 2A, the driving unit DRi outputs 0 V in the case where the ith bit GDi is "0", and the driving unit DRi outputs 15 V in the case where the ith bit GDi is "1". FIG. 2A illustrates an example of a case where GD[10:

1]="1001111111b" (the b at the end indicates that the number within the" is binary).

First, a reset is carried out prior to driving. In other words, GD[10:1] is set to "0000000000b", 0 V is output to the driving units DR1 to DR10, and a voltage VQ is set to VC=7.5 V. VC=7.5 V corresponds to a reset voltage.

Figure 2B:
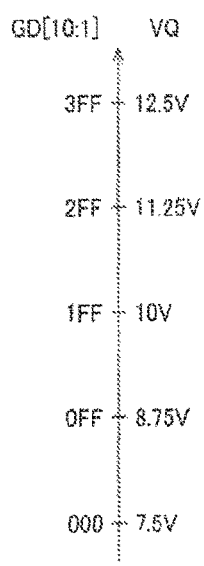

In this reset, a charge accumulated at the data voltage output node NVQ is also conserved in the driving carried out thereafter, and thus based on the principle of charge conservation, Formula FE in FIG. 2A is found. In Formula FE, the sign GDi expresses the value of the bit GDi ("0" or "1"). Looking at the second term on the right side of Formula FE, it can be seen that the tone data GD[10:1] is converted into 1,024-tone data voltages (5 V×0/1,023, 5 V×1/1,023, 5 V×2/1,023, . . . , 5 V×1,023/1,023). FIG. 2B illustrates a data voltage (the output voltage VQ) when the most significant three bits of the tone data GD[10:1] have been changed as an example.

Although positive-polarity driving has been described as an example thus far, it should be noted that negative-polarity driving may be carried out in this embodiment. Inversion driving that alternates positive-polarity driving and negative-polarity driving may be carried out as well. In negative-polarity driving, the outputs of the driving units DR1 to DR10 in the capacitor driving circuit 20 are all set to 15 V in the reset, and the output voltage VQ is set to VC=7.5 V. The logic level of each bit in the tone data GD[10:1] is inverted ("0" to "1" and "1" to "0"), inputted into the capacitor driving circuit 20, and capacitive driving is carried out. In this case, a VQ of 7.5 V is outputted with respect to tone data GD[10:1] of "000h" (the h at the end indicates that the number within the" is a hexadecimal), a VQ of 2.5 V is outputted with respect to tone data GD[10:1] of "3FFh", and the data voltage range becomes 7.5 V to 2.5 V.

As described above, by carrying out charge redistribution between the capacitance CO of the capacitor circuit 10 and the electro-optical panel-side capacitance CP and carrying out capacitive driving, data voltages corresponding to the tone data GD[10:1] can be outputted. Driving using charge redistribution makes it possible to achieve settling at a higher speed than with amplifier driving, in which the voltages are settled through feedback control.

3. Transient Changes in Output Voltage in Capacitive Driving

Figure 3:
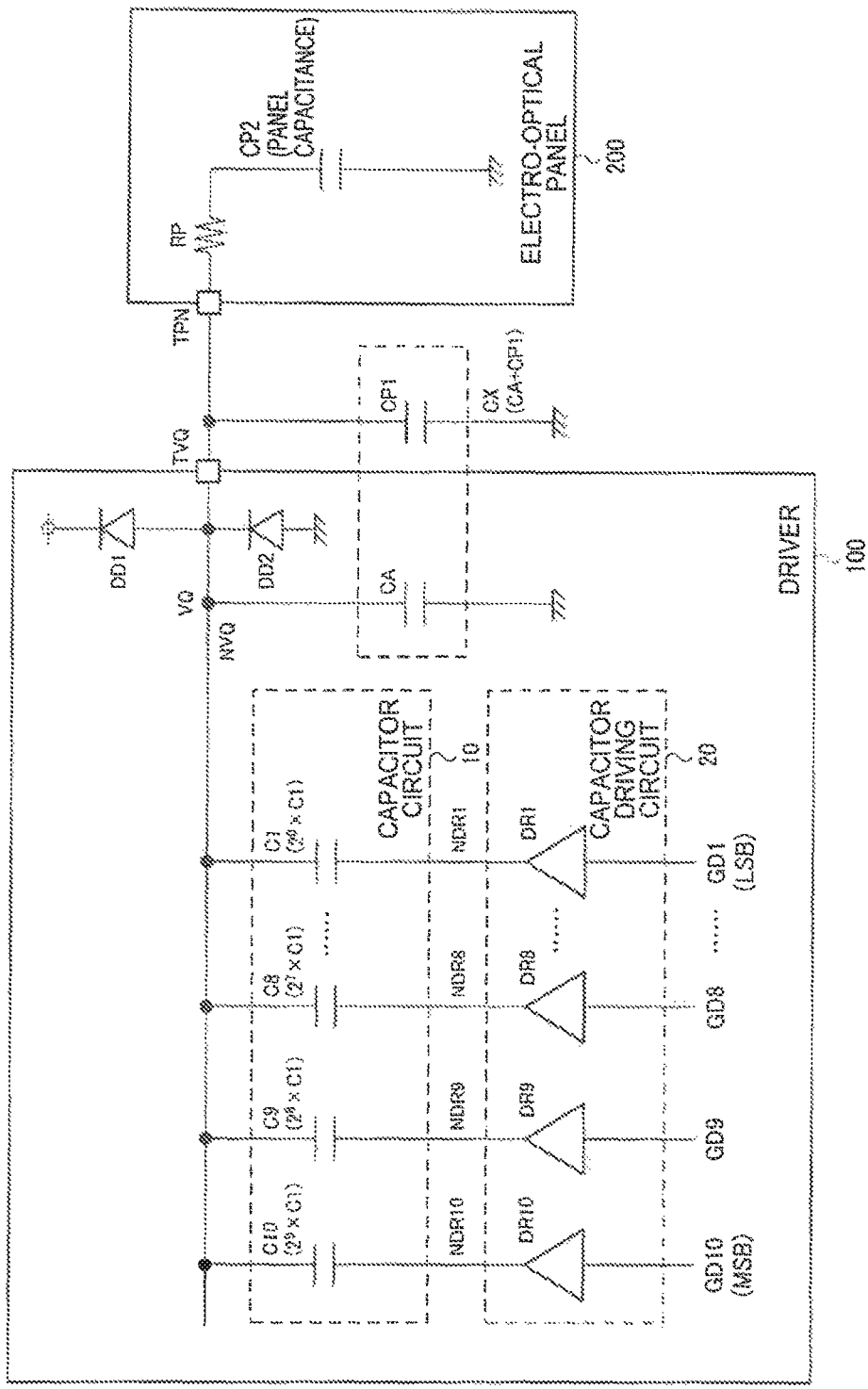
FIG. 3 is a schematic diagram illustrating a driver and an electro-optical panel.

Next, transient changes in the output voltage VQ in capacitive driving will be described. FIG. 3 is a schematic diagram illustrating the driver 100 and the electro-optical panel 200.

Figure 15:
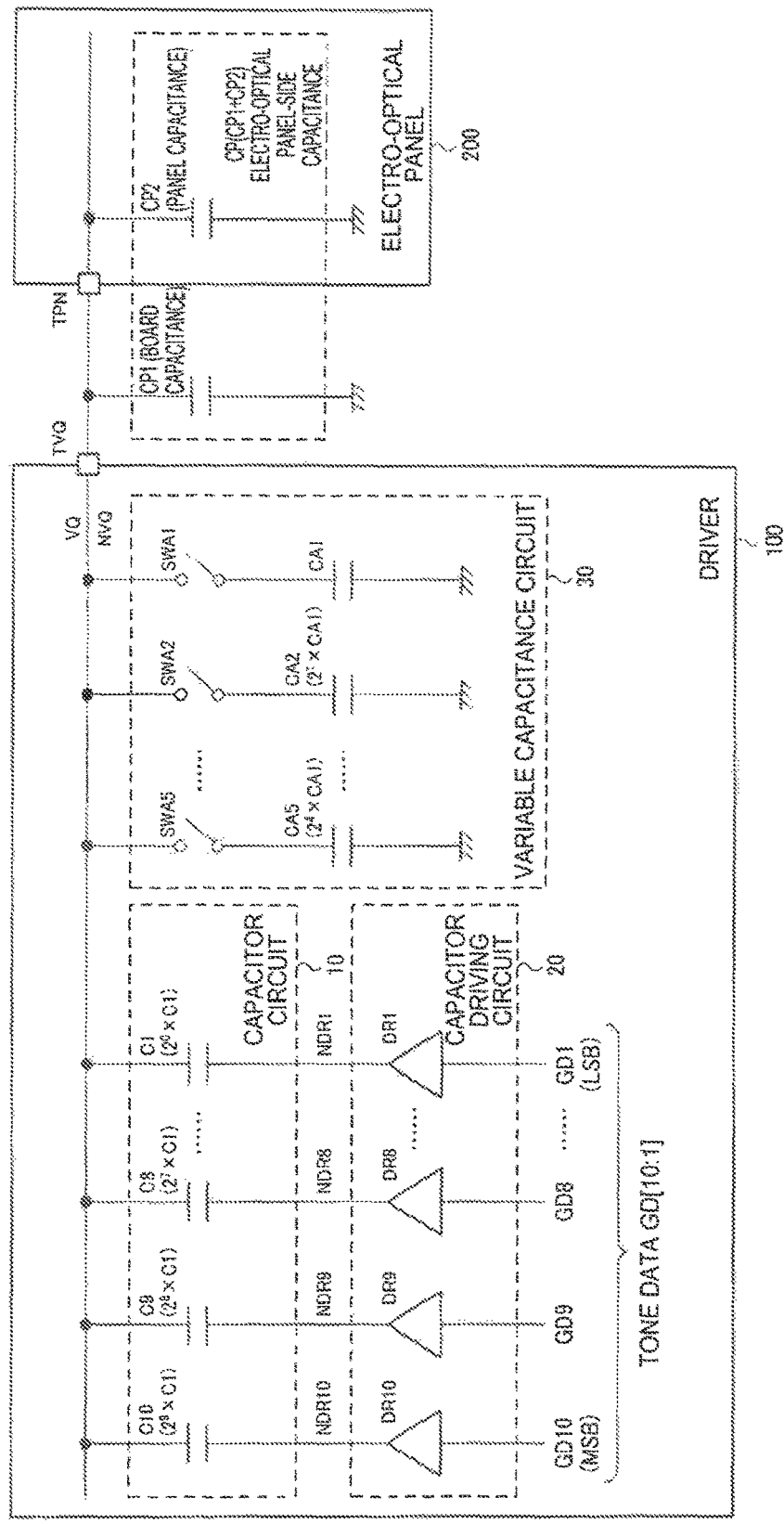
FIG. 15 illustrates a third example of the configuration of a driver.

As illustrated in FIG. 3, a resistance element RP for electrostatic protection is provided between the data voltage input terminal TPN and the panel capacitance CP2 of the electro-optical panel 200. A resistance value of the resistance element RP is 200Ω-1 kΩ, for example. A variable capacitance circuit 30, which will be described later with reference to FIG. 15, is provided at the data voltage output node NVQ of the driver 100, and a capacitance of the variable capacitance circuit 30 corresponds to a capacitance CA. In the case where the capacitance of the capacitor circuit 10 is CO (=C1+C2+ . . . +C10), the capacitance CA is set so that CA+CP=2CO. Assuming that a result of adding the capacitance CA and the board capacitance CP1 is a capacitance CX (=CA+CP1), CX+CP2=2CO.

Assume that an output impedance of the driving units DR1 to DR10 of the capacitor driving circuit 20 is zero. In this case, charge redistribution between the capacitance CO of the capacitor circuit 10 and the capacitance CX is completed at the same time as when the outputs of the driving units DR1 to DR10 change. At this point in time, the charge is not distributed to the panel capacitance CP2 due to the presence of the resistance element RP, and the output voltage VQ rises to a voltage determined by a ratio between the capacitance CO and the capacitance CX. Assume, for example, that the tone data GD[10:1] has changed from "000h" to "3FFh". While the data voltage changes from 7.5 V to 12.5 V in the case where charge redistribution among capacitances including the panel capacitance CP2 has occurred, the capacitance CX is lower than capacitance CX+CP2, and thus the output voltage VQ transiently exceeds 12.5 V. As described above, CX+CP2=2CO, but assume that, for example, CX=(½)·CO and CP2=(3/2)·CO. In this case, the output voltage VQ is 7.5 V+15 V·(CO/(CO+CX))=17.5 V at the point in time when the charge redistribution has occurred between the capacitance CO of the capacitor circuit 10 and the capacitance CX.

Figure 4:
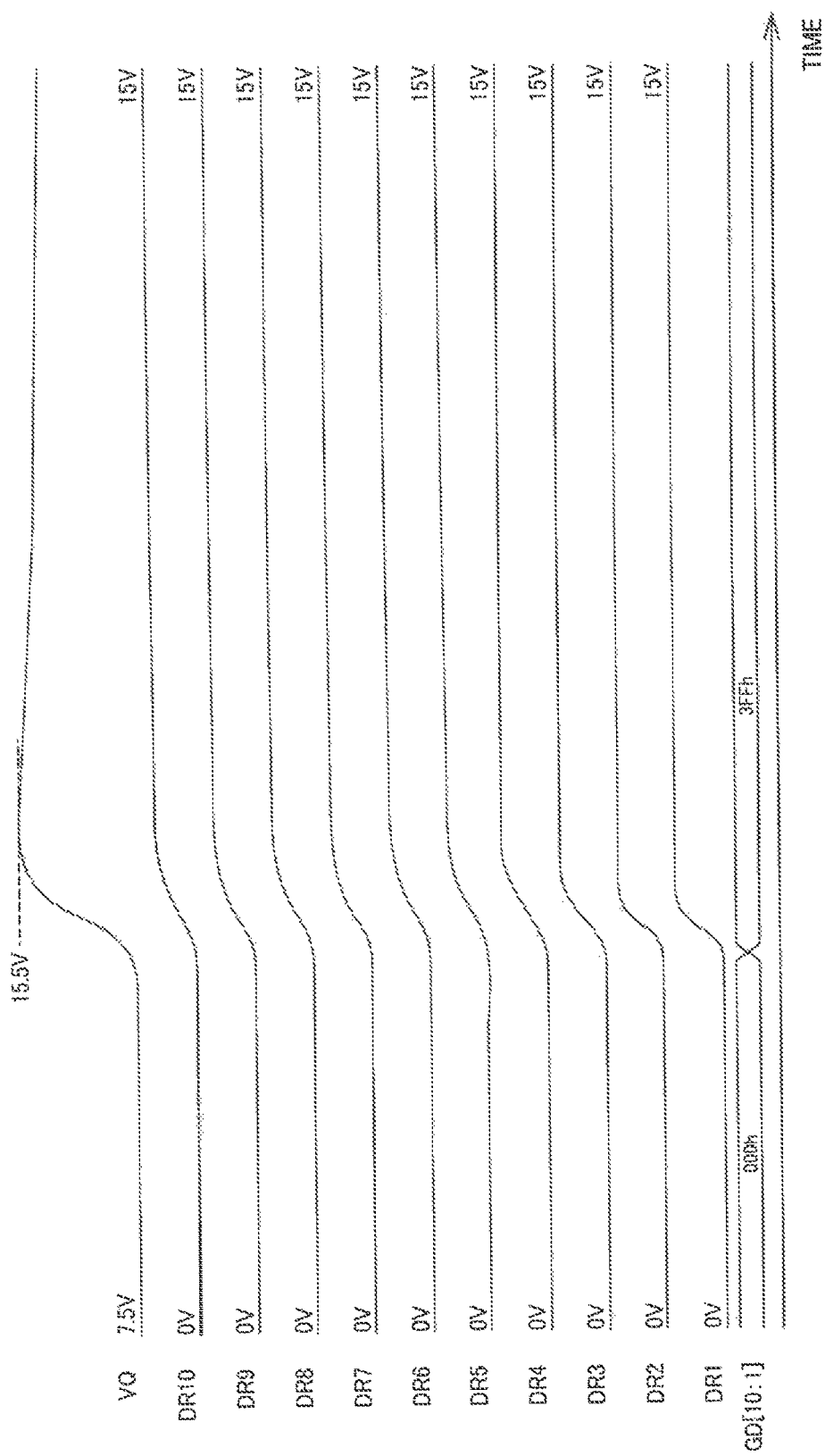
FIG. 4 illustrates a result of simulating a change over time in an output voltage in capacitive driving according to a comparative example.

FIG. 4 illustrates a result of simulating a change over time in the output voltage VQ in capacitive driving according to a comparative example. FIG. 4 is a waveform diagram of the output voltages of the driving units DR1 to DR10 and the output voltage VQ in the capacitive driving in the case where the bits GD1 to GD10 of the tone data GD[10:1] supplied to the driving units DR1 to DR10 are simultaneously changed from "0" to "1".

As illustrated in FIG. 4, after the tone data GD[10:1] has changed from "000h" to "3FFh", the output voltages of the driving units DR1 to DR10 begin to rise almost simultaneously. When the output voltages of the driving units DR1 to DR10 rise, charges are supplied to the data voltage output node NVQ from the capacitors C1 to C10, and the voltage VQ at the data voltage output node NVQ rises. Because the rise in the output voltages of the driving units DR1 to DR10 are almost simultaneous, the supplies of charges overlap, the voltage VQ rises suddenly, and the voltage VQ reaches 15.5 V, exceeding a power source voltage of 15 V.

Note that the output impedance of the driving units DR1 to DR10 is not zero in the simulation, and thus the rise in the output voltage VQ is less sharp than in the case where the charge redistribution is assumed to be completed instantly between the capacitance CO and the capacitance CX. In this case, the maximum value of the output voltage VQ does drop, but because fast capacitive driving is necessary to drive a high-resolution panel, a lower output impedance is desirable for the driving units DR1 to DR10. Accordingly, if an attempt is made to realize high-speed capacitive driving, there is an increased likelihood that the supply of charges from the capacitors C1 to C10 will accelerate and the timings at which charges are supplied will overlap, causing the voltage VQ to exceed the power source voltage.

After the output voltage VQ has reached the maximum value, charge redistribution occurs between the capacitances CO and CX and the capacitance CP2 via the resistance element RP, and thus the output voltage VQ approaches the desired data voltage (12.5 V). As indicated in FIG. 13A and the like, the capacitance CO of the capacitor circuit 10 is 64 pF, for example. Assuming that the resistance value of the resistance element RP of the electro-optical panel 200 is 500 n, for example, a time constant of the capacitances CO, CX, CP2, and the resistance element RP is approximately 64 pF·500Ω=32 ns.

As described above, in capacitive driving, the output voltage VQ may transiently exceed the power source voltage (15 V). As illustrated in FIG. 3, diodes DA1 and DA2, for example, are provided at the data voltage output terminal TVQ of the driver 100 as a circuit for electrostatic protection, and thus the charge escapes to the power source via the diode DA1 from the data voltage output node NVQ in the case where the output voltage VQ has exceeded the power source voltage. As illustrated in FIG. 2A, in capacitive driving, the desired data voltage is outputted by carrying out charge redistribution in a state where the charge is conserved, and thus the desired data voltage can no longer be obtained when the charge escapes. Note that in the case of negative-polarity driving, it is possible that the output voltage VQ will transiently fall below the power source voltage (0 V), in which case the charge will escape to the power source via the diode DA2 and the desired data voltage can no longer be obtained.

Meanwhile, in the case where the diodes DA1 and DA2 and so on provide insufficient electrostatic protection, it is possible that the output voltage VQ will exceed the breakdown voltage of the data voltage output terminal TVQ and result in electrostatic breakdown. For example, in the variable capacitance circuit 30, which will be described later with reference to FIG. 15, switching elements SWA1 to SWA5 (transistors, for example) are connected to the data voltage output node NVQ, and the switching elements SWA1 to SWA5 may experience electrostatic breakdown.

The phenomenon described above is caused by the resistance element for electrostatic protection in the electro-optical panel 200. In other words, a load-side capacitance (the panel capacitance CP2) being present outside of the driver (IC) rather than the load-side capacitance being present within the IC (as in JP-A-2000-341125 and so on, for example) is a factor.

4. Second Example of Configuration of Driver

Figure 5:
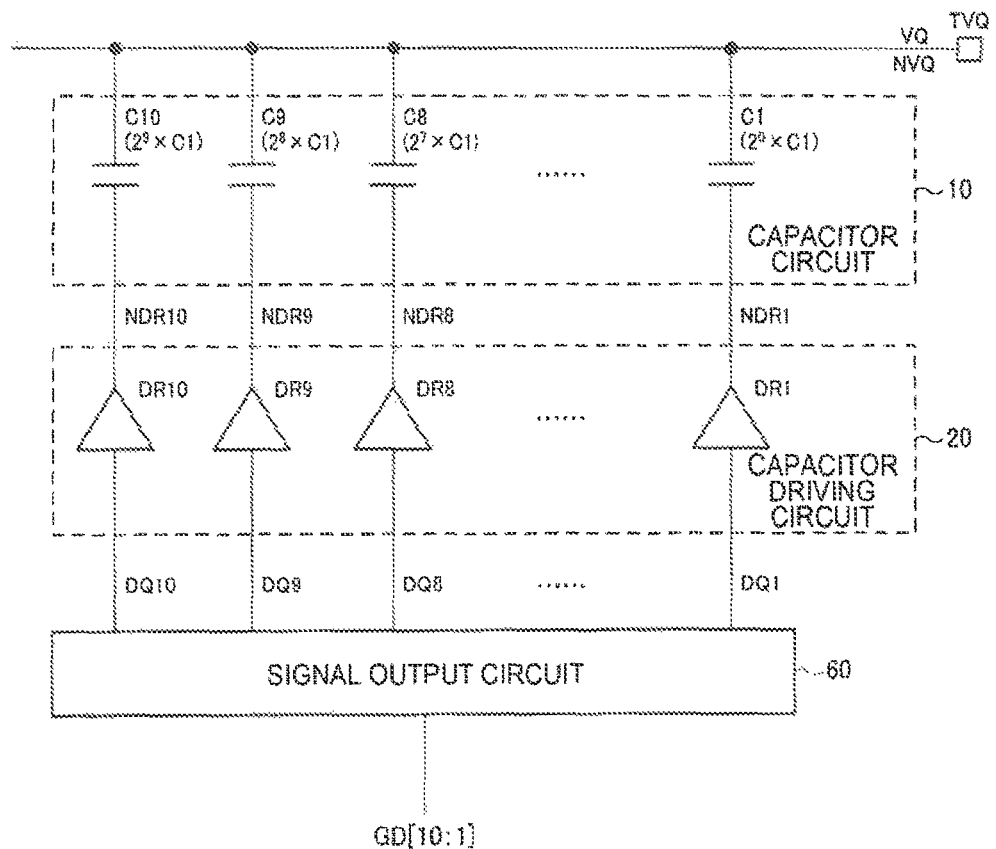
FIG. 5 illustrates a second example of the configuration of a driver.

FIG. 5 illustrates a second example of the configuration of a driver according to this embodiment, capable of solving the stated problem. This driver 100 includes the capacitor circuit 10, the capacitor driving circuit 20, a signal output circuit 60, and the data voltage output terminal TVQ. Note that constituent elements that are the same as constituent elements already described are assigned the same reference numerals, and descriptions of those constituent elements are omitted as appropriate.

The signal output circuit 60 outputs bits DQ1 to DQ10 of data DQ[10:1] to the driving units DR1 to DR10 based on the tone data GD[10:1]. At this time, the bits DQ1 to DQ10 are outputted having increased a delay time more on the least significant bit side than on the most significant bit side. In other words, a timing of a change in the logic level on the least significant bit side is delayed relative to a timing of a change in the logic level on the most significant bit side. The logic levels of the bits DQ1 to DQ10 are the same logic levels as the bits GD1 to GD10 of the tone data GD[10:1]. Note that in the case where negative-polarity driving is carried out, the logic levels of the bits DQ1 to DQ10 may be the logic levels of the bits GD1 to GD10 inverted.

Figure 6:
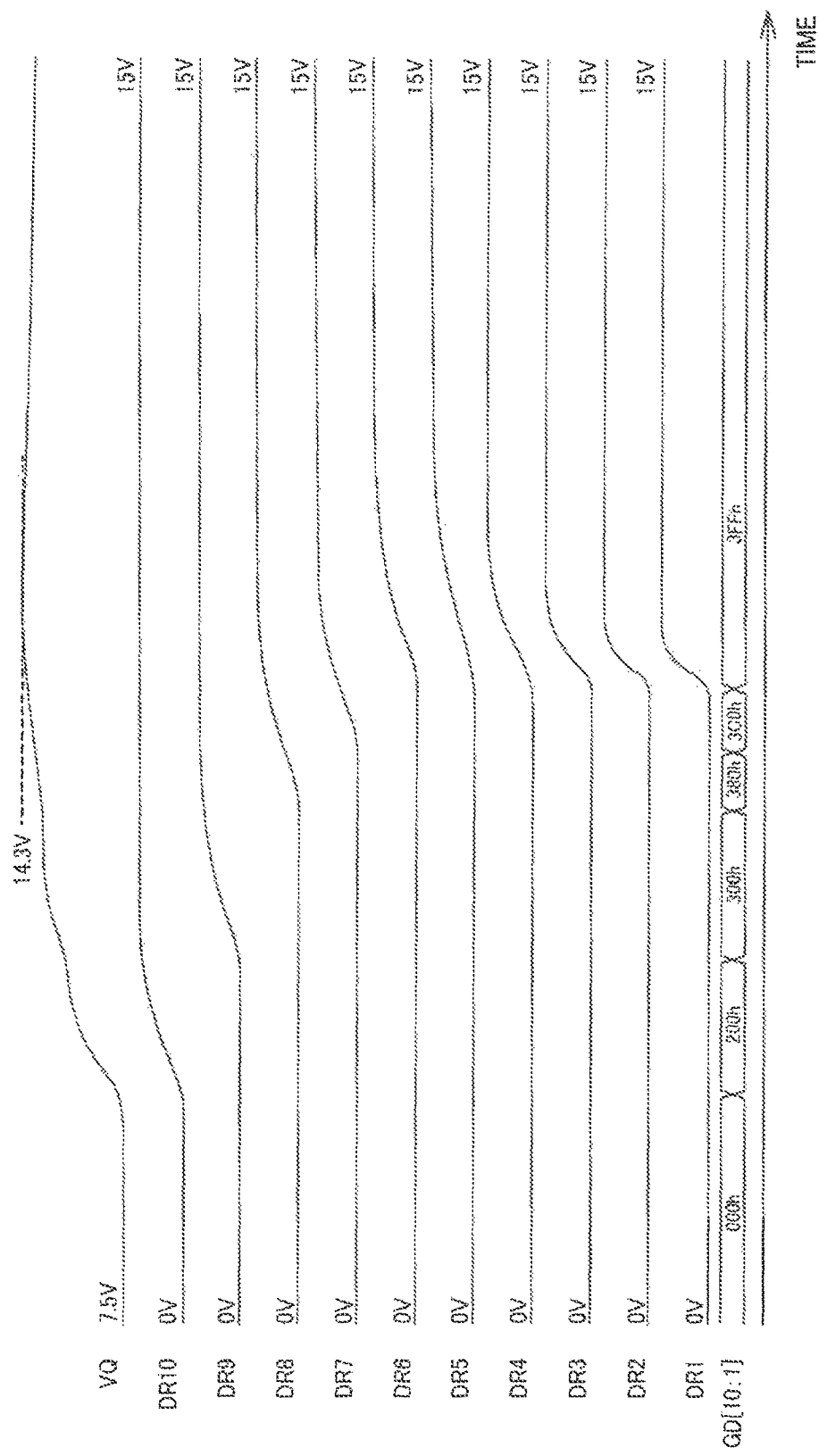
FIG. 6 illustrates a result of simulating a change over time in an output voltage in capacitive driving according to an embodiment.

FIG. 6 illustrates a result of simulating a change over time in the output voltage VQ in capacitive driving according to this embodiment. FIG. 6 is a waveform diagram illustrating a case where the tone data GD[10:1] is changed from "000h" to "3FFh", and is a waveform diagram illustrating a case of a simulation under the same conditions as those in FIG. 4 (in other words, applying the driver 100 of FIG. 5 to a circuit model such as that illustrated in FIG. 3).

As illustrated in FIG. 6, the signal output circuit 60 changes the data DQ[10:1] from "000h" to "200h", "300h", "380h", "3C0h", and "3FFh" in that order. In other words, the most significant bit DQ10 changes from "0" to "1", the next bit DQ9 changes from "0" to "1", the next bit DQ8 changes from "0" to "1", the next bit DQ7 changes from "0" to "1", and the next bits DQ1 to DQ6 change from "0" to "1". In the example in FIG. 6, it takes approximately 5 nanoseconds for the data DQ[10:1] to change from "200h" to "3FFh".

By doing so, the capacitor C10, whose charge supply amount is greatest, is driven first, after which the capacitors C9 to C7 are driven in order from the capacitor having the greatest charge supply amount; lastly, the capacitors C6 to C1, whose charge supply amounts are small, are driven. Shifting the driving timings in this manner shifts the timings at which the charges are supplied from the capacitors C1 to C10 to the data voltage output node NVQ, and thus the rise in the voltage VQ is gradual. The charge moves to the panel capacitance CP2 via the resistance element RP for electrostatic protection while the voltage VQ is rising gradually, and thus the peak value of the voltage VQ becomes lower. The peak value is 14.3 V in the example illustrated in FIG. 6, which is lower than the power source voltage of 15 V.

Furthermore, by starting the driving from the capacitor having the greatest capacitance, the peak value of the voltage VQ can be reduced while maintaining high-speed capacitive driving. In other words, by first driving the capacitor whose charge supply amount is greatest, the time required to redistribute that charge to the panel capacitance CP2 via the resistance element RP for electrostatic protection can be secured. Voltage settling takes more time the greater the charge supply amount is, and thus starting the driving from the capacitor whose capacitance is greatest makes it possible to reduce the peak value of the voltage VQ while suppressing an increase in the settling time.

5. Detailed Configuration of Signal Output Circuit

Figure 7:
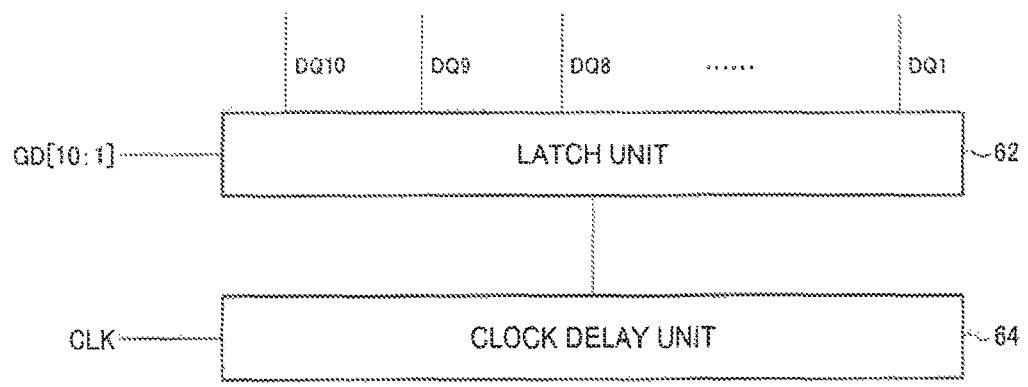
FIG. 7 illustrates an example of the detailed configuration of a signal output circuit.

FIGS. 7 to 10 illustrate an example of the detailed configuration of the signal output circuit 60. As illustrated in FIG. 7, the signal output circuit 60 includes a latch unit 62 and a clock delay unit 64.

The latch unit 62 latches the bits GD1 to GD10 of the tone data GD[10:1] and outputs the latched bits GD1 to GD10 as the bits DQ1 to DQ10 of the data DQ[10:1]. At this time, the timings at which the bits DQ1 to DQ10 are outputted differ depending on the latch timings.

The clock delay unit 64 generates, based on a clock signal CLK (supplied from a control circuit 40 illustrated in FIG. 17, for example) a clock signal for the latch unit 62 to latch the bits GD1 to GD10. At this time, a clock signal delayed based on the timing of the latch is generated.

Figure 8:
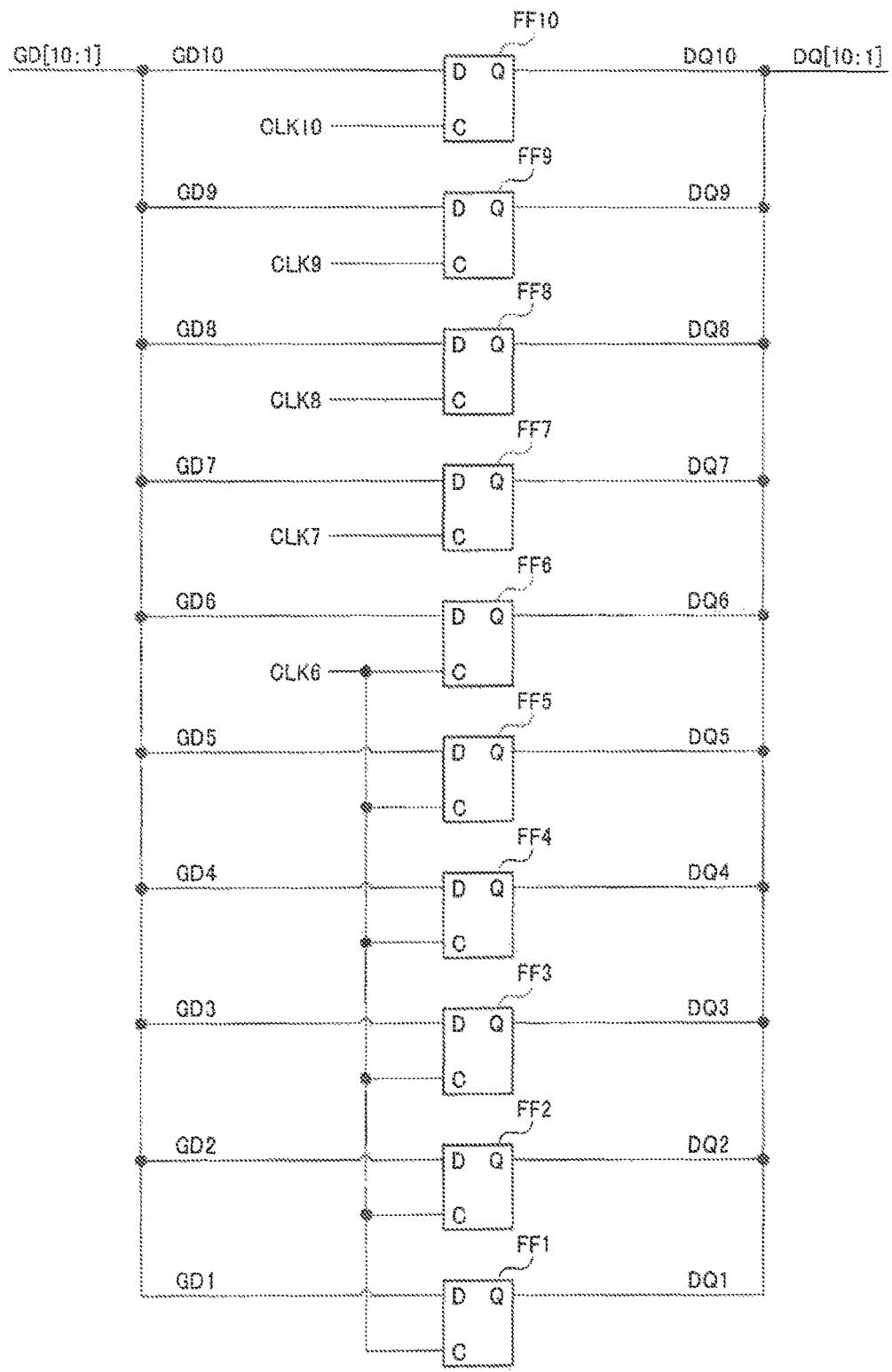
FIG. 8 illustrates an example of the detailed configuration of a latch unit.

FIG. 8 illustrates an example of the detailed configuration of the latch unit 62. The latch unit 62 includes flip-flop circuits FF1 to FF10.

The flip-flop circuits FF1 to FF6 on the least significant bit side latch the bits GD1 to GD6 based on a common clock signal CLK6. The flip-flop circuits FF7 to FF10 on the most significant bit side latch the bits GD7 to GD10 based on respective clock signals CLK7 to CLK10 having different delay times. The flip-flop circuits latch input signals when, for example, the clock signals rise, and output the latched input signals at the next rise of the clock signals. In other words, the timings at which the bits DQ1 to DQ10 are outputted are determined by the delay times of the rising edges (or falling edges) of the clock signals CLK6 to CLK10.

Figure 9:
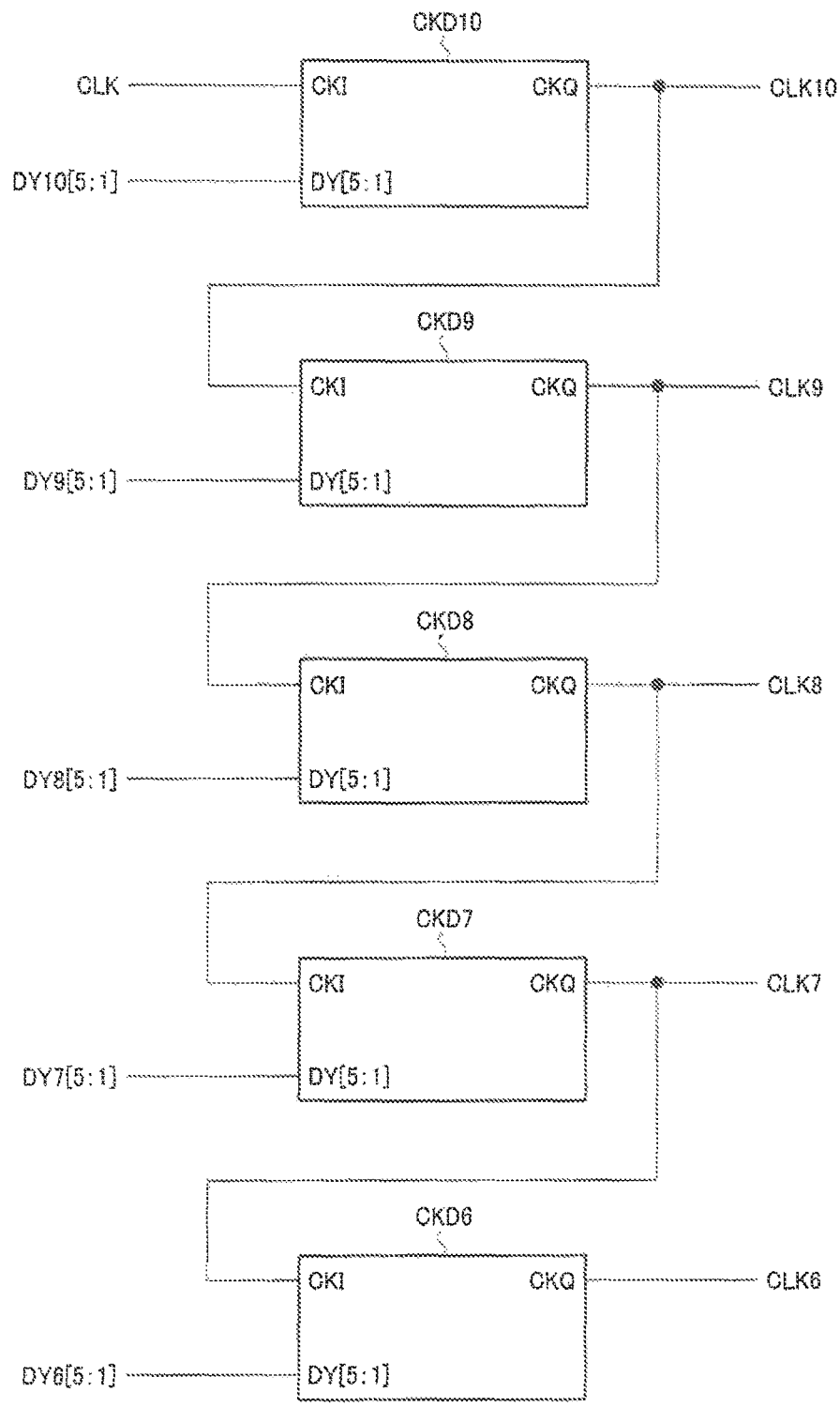
FIG. 9 illustrates an example of the detailed configuration of a clock delay unit.

FIG. 9 illustrates an example of the detailed configuration of the clock delay unit 64. The clock delay unit 64 includes delay units CKD6 to CKD10 that output the clock signals CLK6 to CLK10.

The clock signal CLK is inputted into the delay unit CKD10, which corresponds to the most significant bit. The delay unit CKD10 delays that clock signal CLK and outputs the clock signal CLK10. The clock signal CLK10, which corresponds to the next significant bit to CLK9, is inputted into the delay unit CKD9. The delay unit CKD9 delays that clock signal CLK10 and outputs the clock signal CLK9. Likewise, the clock signals CLK9 to CLK7, which respectively correspond to the next significant bits to CLK8 to CLK6, are inputted into the delay units CKD8 to CKD6, and the delay units CKD8 to CKD6 delay the clock signals CLK9 to CLK7 and output the clock signals CLK8 to CLK6.

Setting values DY6[5:1] to DY10[5:1] that set the delay times are inputted into the delay units CKD6 to CKD10. The delay units CKD6 to CKD10 delay the clock signals CLK6 to CLK10 by delay times corresponding to the setting values DY6[5:1] to DY101[5:1]. These delay times are delay times for the clock signals corresponding to the respective next significant bits, and thus the delay time for the clock signal CLK corresponds to the total delay time on the most significant bit side. For example, the delay time of the clock signal CLK9 relative to the clock signal CLK is obtained by adding the delay time of the clock signal CLK10 relative to the clock signal CLK (the setting value DY10[5:1]) and the delay time of the clock signal CLK9 relative to the clock signal CLK10 (the setting value DY9[5:1]).

Figure 10:
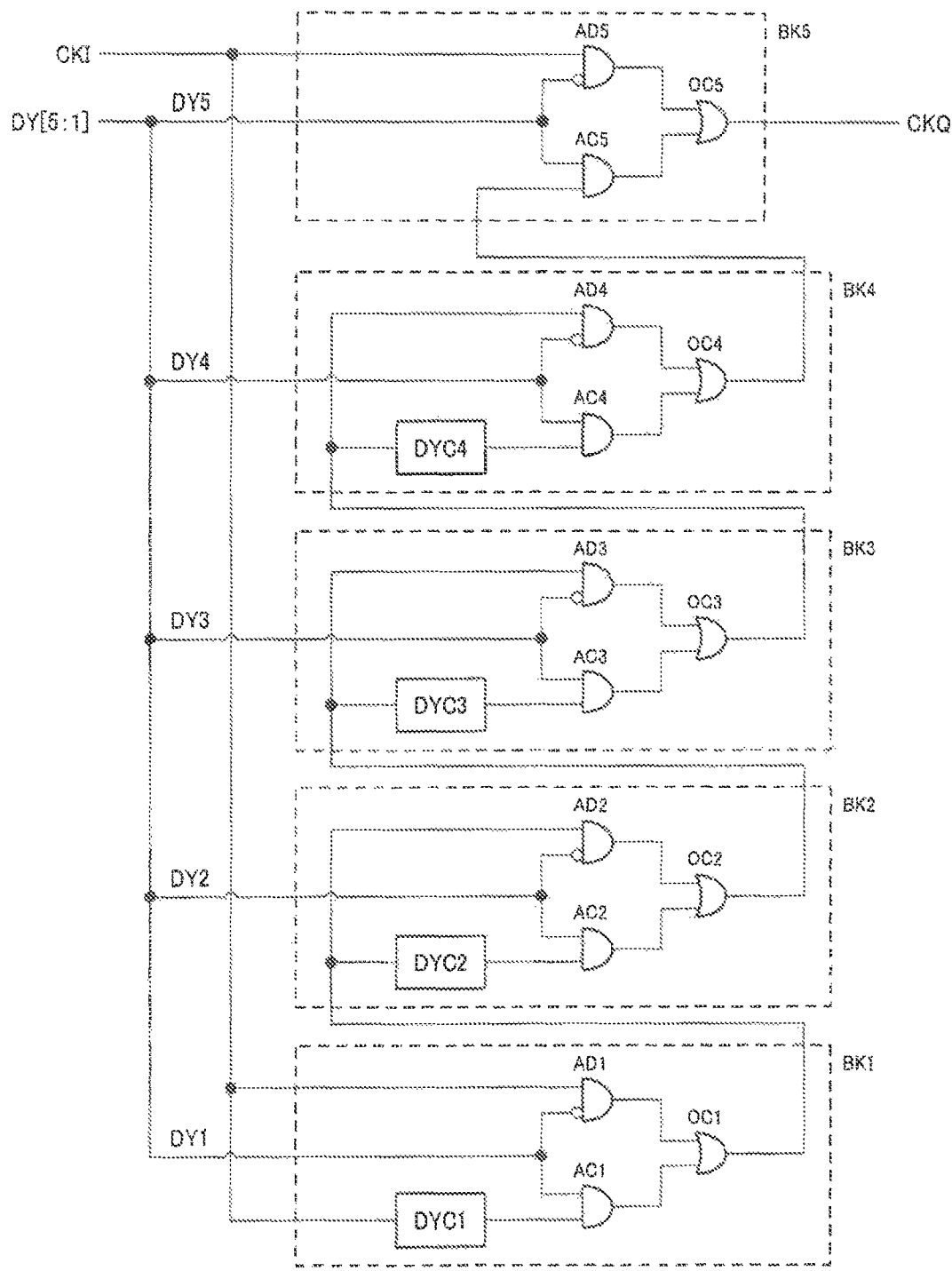
FIG. 10 illustrates an example of the detailed configuration of a delay unit.

FIG. 10 illustrates an example of the detailed configurations of the delay units CKD6 to CKD10. FIG. 10 illustrates the configuration of a single delay unit, and the configuration is the same for the delay units CKD6 to CKD10. The delay unit illustrated in FIG. 10 includes blocks BK1 to BK5. The block BK5 includes AND circuits AC5 and AD5 and an OR circuit OC5. The block BK4 includes a delay circuit DYC4, AND circuits AC4 and AD4, and an OR circuit OC4. The block BK3 includes a delay circuit DYC3, AND circuits AC3 and AD3, and an OR circuit OC3. The block BK2 includes a delay circuit DYC2, AND circuits AC2 and AD2, and an OR circuit OC2. The block BK1 includes a delay circuit DYC1, AND circuits AC1 and AD1, and an OR circuit OC1.

The delay circuits DYC1 to DYC4 are configured as circuits in which, for example, a plurality (an even number) of logic inverting circuits (inverters) are connected in series.

In the case where the bit DY5 of the setting value DY[5:1] is 0, a clock signal CKI traverses the AND circuit AD5 and the OR circuit OC5 of the block BK5 and is outputted as a clock signal CKQ regardless of the values of the bits DY4 to DY1. The delay time is the shortest.

In the case where the bit DY5 of the setting value DY[5:1] is 1, the clock signal CKI traverses the blocks BK2, BK3, and BK4 from the block BK1, traverses the AND circuit AC5 and the OR circuit OC5 of the block BK5, and is outputted as the clock signal CKQ. Whether or not to traverse the delay circuits DYC4 to DYC1 of the blocks BK4 to BK1 is selected in accordance with the values of the bits DY4 to DY1, and the delay time changes accordingly. To describe using the block BK1 as an example, in the case where the bit DY1 is "0", the clock signal CKI traverses the AND circuit AD1 and the OR circuit OC1, whereas in the case where the bit DY1 is "1", the clock signal CKI traverses the delay circuit DYC1, the AND circuit AC1, and the OR circuit OC1. The delay time is longer in the case where the bit DY1 is "1". The delay times in the blocks BK2 to BK4 are determined in the same manner, and a result of totaling the delay times in the blocks BK1 to BK5 serves as the delay time of the clock signal CKQ relative to the clock signal CKI.

6. Variation on Configuration of Signal Output Circuit

Figure 11:
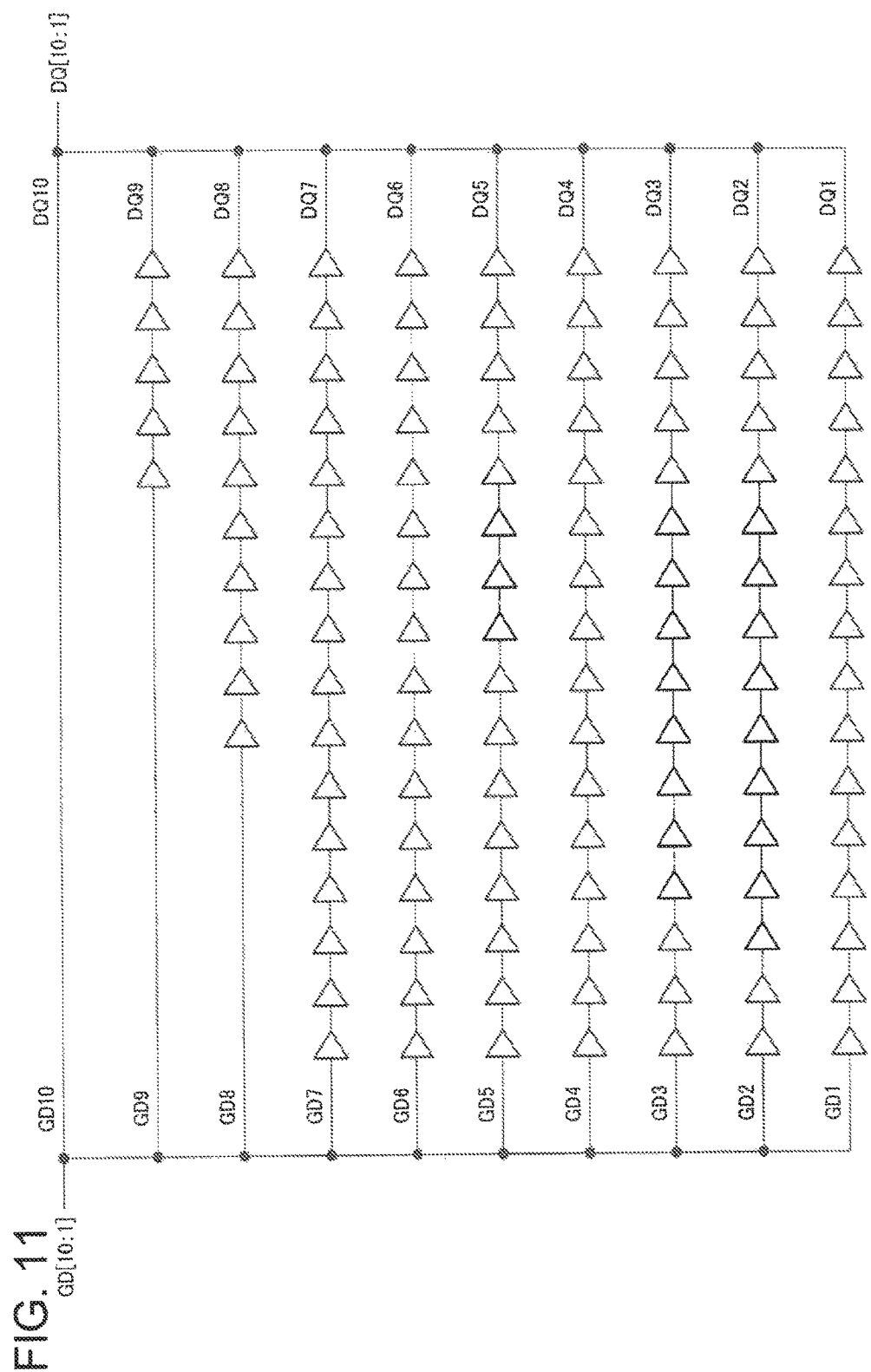
FIG. 11 illustrates an example of a variation on the configuration of a signal output circuit.

FIG. 11 illustrates an example of a variation on the configuration of the signal output circuit 60. In this example of a variation on the configuration, the delay times of the bits DQ1 to DQ10 relative to the bits GD1 to GD10 are determined using delay elements (buffers).

Specifically, the most significant bit GD10 does not traverse a buffer, and is outputted as-is as the bit DQ10. The bit GD9 traverses five buffers and is outputted as the bit DQ9. The bit GD8 traverses ten buffers and is outputted as the bit DQ8. The bits GD7 to GD1 traverse 16 buffers and are outputted as the bits DQ7 to DQ1, respectively. In other words, the delay time of the most significant bit DQ10 is minimum, and the delay time increases toward the least significant bit side, in order of the bit DQ9, DQ8, DQ7, and so on. The delay times of the bits DQ6 to DQ1 are the same as the delay time of the bit DQ7. Note that the buffers are configured as circuits in which, for example, two logic inverting circuits (inverters) are connected in series.

Although the foregoing describes an example of a case where the delay time is adjusted based on the number of buffers, the invention is not limited thereto, and the delay time may be adjusted based on the size of the buffer, for example.

According to the embodiment described thus far, the driver 100 includes the capacitor driving circuit 20 and the capacitor circuit 10. The capacitor driving circuit 20 outputs first to tenth capacitor driving voltages (0 V or 15 V), corresponding to the tone data GD[10:1], to first to tenth capacitor driving nodes NDR1 to NDR10. The capacitor circuit 10 has the first to tenth capacitors C1 to C10 provided between the first to tenth capacitor driving nodes NDR1 to NDR10 and the data voltage output terminal TVQ. The capacitor driving circuit 20 includes the first to tenth driving units DR1 to DR10 that output the first to tenth capacitor driving voltages. Of the first to tenth capacitors C1 to C10, in the case where the capacitance of the tenth capacitor is the highest, the ninth driving unit DR9 outputs the ninth capacitor driving voltage after the tenth driving unit DR10 has outputted the tenth capacitor driving voltage.

By doing so, the supply of charges to the data voltage output terminal TVQ from the capacitor C10, whose capacitance is highest, and the capacitor C9, whose capacitance is the next highest, are started at different timings. Ensuring that the supplies of charges from capacitors having high capacitances do not overlap makes it possible to suppress a rise in the voltage VQ at the data voltage output terminal TVQ and reduce (or increase, in the case of negative-polarity driving) the peak value of the voltage VQ. Through this, it is possible to avoid a situation in which the peak value of the voltage VQ exceeds the power source voltage of 15 V (or drops below the power source voltage of 0 V, in the case of negative-polarity driving).

In addition, although a greater charge supply amount means that it takes more time for the charge to be distributed to the panel capacitance CP2, the capacitor C10, whose capacitance is high, is driven first in this embodiment, which makes it easy to secure time for charge distribution. This makes it possible to maintain high speed for the capacitive driving and handle the high-resolution electro-optical panel 200.

In addition, in this embodiment, the capacitance of the ith capacitor Ci (where i is a natural number, with $1 \le i \le n=10$) is greater than the capacitance of a jth capacitor Cj (where j<i, and j is a natural number, with $1 \le j \le n=10$). In this case, a jth driving unit DRj outputs a jth capacitor driving voltage after the ith driving unit DRi has outputted an ith capacitor driving voltage. For example, in the example illustrated in FIG. 6, C10>C9>C8>C7>C6, and the driving units DR10, DR9, DR8, DR7, and DR6 output the capacitor driving voltages in order from the capacitor having the highest capacitance.

By doing so, the timings at which the supplies of charges to the data voltage output terminal TVQ from the capacitors Ci and Cj start are shifted, which makes it possible to suppress a rise in the voltage VQ at the data voltage output terminal TVQ. In addition, by driving the capacitor Ci, whose capacitance is higher, first, it is possible to secure an amount of time to distribute the charge thereof to the panel capacitance CP2 via the resistance element RP for electrostatic protection, and the high speed of the capacitive driving can be maintained.

In addition, in this embodiment, in the case where the delay time of the signal in the ith driving unit DRi is represented by tdi and the delay time of the signal in the jth driving unit DRj is represented by tdj, tdi>tdj. The delay time of a jth input signal inputted into the jth driving unit DRj (a bit DQj from the signal output circuit 60) relative to an ith input signal inputted into the ith driving unit DRi (a bit DQi from the signal output circuit 60) is greater than tdi−tdj.

A delay time from the ith capacitor driving voltage outputted by the ith driving unit DRi to the jth capacitor driving voltage outputted by the jth driving unit DRj is obtained by subtracting, from the delay time from the ith input signal to the jth input signal, a difference in the delay times in the driving units (tdi−tdj). In this embodiment, the delay time from the ith input signal to the jth input signal is greater than the difference in the delay times in the driving units (tdi−tdj), and thus the jth driving unit DRj can output the jth capacitor driving voltage after the ith driving unit DRi has outputted the ith capacitor driving voltage.

Here, tdi becomes greater than tdj because the transistor sizes of the final stages of the buffers that constitute the ith driving unit DRi (IQA, PQA, and NQA in FIG. 12A and IQB in FIG. 12B) are greater than the sizes of the final stages of the buffers that constitute the jth driving unit DRj (FIGS. 13A and 13B, for example). Alternatively, this is because the number of stages in the buffers that constitute the ith driving unit DRi is greater than the number of stages in the buffers that constitute the jth driving unit DRj. Such a configuration is employed because the capacitances of the capacitors Ci and Cj, which are the loads of the driving, are in a relationship of Ci>Cj, and it is necessary for the driving unit DRi to have higher driving capability than the driving unit DRj.

In addition, in this embodiment, the driver 100 includes the signal output circuit 60 that outputs the first to tenth input signals (the bits DQ1 to DQ10) to the first to tenth driving units DR1 to DR10. The signal output circuit 60 outputs the first to tenth input signals to the first to tenth driving units DR1 to DR10 having delayed the ninth input signal more than the tenth input signal.

By doing so, the ninth input signal inputted into the driving unit DR9 can be delayed relative to the tenth input signal inputted into the driving unit DR10. Then, by the driving unit DR10 buffering the tenth input signal and the driving unit DR9 buffering the ninth input signal, the ninth driving unit DR9 can output the ninth capacitor driving voltage after the tenth driving unit DR10 has outputted the tenth capacitor driving voltage.

In addition, in this embodiment, the signal output circuit 60 outputs the jth input signal (the bit DQj) delayed more than the ith input signal (the bit DQi). For example, in the example of the configuration illustrated in FIGS. 7 to 10, the first to tenth input signals are outputted to the first to tenth driving units DR1 to DR10 having delayed the ninth input signal (the bit DQ9) more than the tenth input signal (the bit DQ10), the eighth input signal (the bit DQ8) more than the ninth input signal (the bit DQ9), the seventh input signal (the bit DQ7) more than the eighth input signal (the bit DQ8), and the sixth input signal (the bit DQ6) more than the seventh input signal (the bit DQ7).

By doing so, the jth input signal inputted into the driving unit DRj can be delayed relative to the ith input signal inputted into the driving unit DRi. Then, by the driving unit DRi buffering the ith input signal and the driving unit DRj buffering the jth input signal, the jth driving unit DRj can output the jth capacitor driving voltage after the ith driving unit DRi has outputted the ith capacitor driving voltage.

7. Capacitor Driving Circuit

In the embodiment described above, the peak value of the output voltage VQ is reduced by causing the timings at which the driving units DR1 to DR10 of the capacitor driving circuit 20 are driven to differ, but the peak value of the output voltage VQ can also be reduced by adjusting the driving capabilities of the driving units DR1 to DR10. This method will be described hereinafter.

Figure 12A:
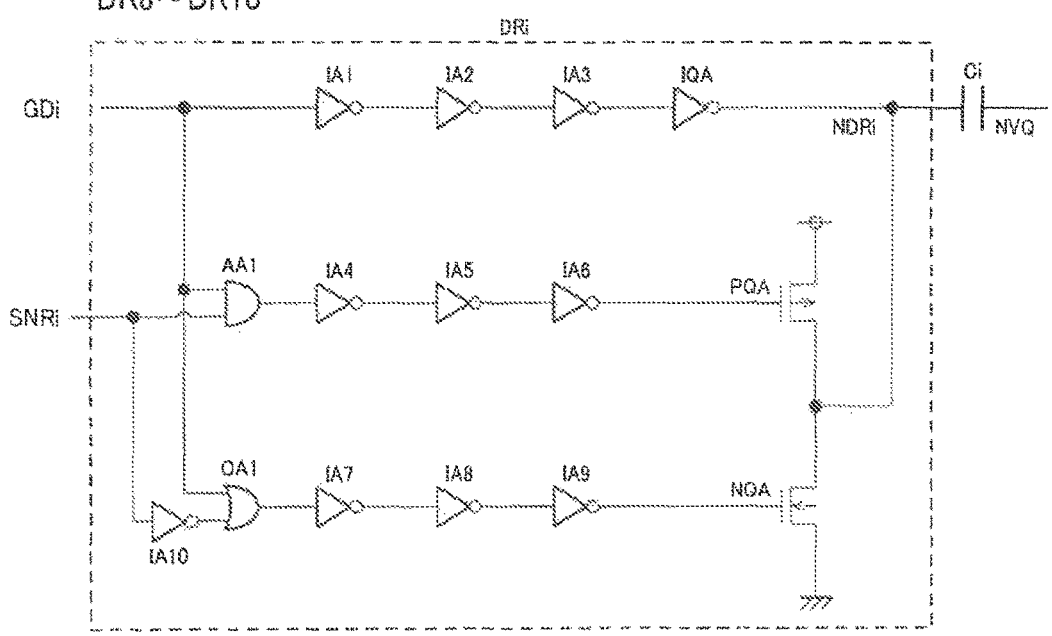
FIGS. 12A and 12B are examples of the detailed configuration of a capacitor driving circuit.
Figure 12B:
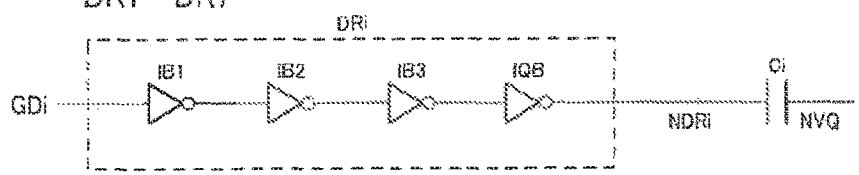

FIGS. 12A and 12B are examples of the detailed configuration of the capacitor driving circuit 20. FIG. 12A is a diagram illustrating examples of the configurations of the driving units DR8 to DR10 that correspond to the most significant bit side of the tone data GD[10:1]. FIG. 12B is a diagram illustrating examples of the configurations of the driving units DR1 to DR7 that correspond to the least significant bit side of the tone data GD[10:1]. Although the border between the most significant bit side and the least significant bit side is between the seventh bit and the eighth bit here, the invention is not limited thereto. For example, it is sufficient for at least the driving unit DR10, which corresponds to the most significant bit, has the configuration illustrated in FIG. 12A.

As illustrated in FIG. 12A, each driving unit DRi of the driving units DR8 to DR10 on the most significant bit side includes logic inverting circuits IA1 to IA10 and IQA (inverters and buffers), an AND circuit AA1, an OR circuit OA1, a P-type transistor PQA, and an N-type transistor NQA.

The logic inverting circuits IA1 to IA3 and IQA are connected in series, and drive the capacitor Ci by buffering the bit GDi of the tone data. The logic inverting circuit IQA in the final stage is constituted of the largest-size transistor, and the size thereof determines the driving capability. The logic inverting circuits IA1 to IA3 in the previous stages serve as predrivers that drive the final stage (IQA).

The AND circuit AA1, the OR circuit OA1, the logic inverting circuits IA4 to IA10, the P-type transistor PQA, and the N-type transistor NQA serve as a circuit that switches the driving capability of the driving unit DRi. In other words, in the case where a control signal SNRi is active (high-level), the capacitor Ci is driven by buffering the bit GDi. In the case where the control signal SNRi is non-active (low-level), the P-type transistor PQA and the N-type transistor NQA turn off and the output enters a high-impedance state. In this switching circuit, the P-type transistor PQA and the N-type transistor NQA are in the final stage, and are the same size as, for example, a transistor that constitutes the logic inverting circuit IQA. In this case, the driving capability is cut in half when the control signal SNRi is non-active.

As illustrated in FIG. 12B, each driving unit DRi of the driving units DR1 to DR7 on the least significant bit side includes logic inverting circuits IB1 to IB3 and IQB (inverters and buffers).

The driving unit DRi on the least significant bit side does not include a switching circuit. The logic inverting circuits IB1 to IB3 and IQB are connected in series, and drive the capacitor Ci by buffering the bit GDi of the tone data. The logic inverting circuit IQB in the final stage is constituted of the largest-size transistor, and the size thereof determines the driving capability.

FIGS. 13A and 13B illustrate examples of the driving capability of the driving units DR1 to DR10 according to this embodiment. FIGS. 13A and 13B illustrate the capacitances of the capacitors C1 to C10 and the sizes (gate widths W) of the P-type transistors and N-type transistors that constitute the final stages of the driving units DR1 to DR10. In addition, a ratio Di/Ci between a driving capability Di and the capacitance of the capacitor Ci, in the case where the driving capability Di corresponds to the size of the transistor (N-type, here), is indicated as well. Note that in FIG. 13A, the size of the transistors of the driving units DR8 to DR10 whose driving capabilities can be switched are obtained by totaling the sizes of the transistor of the logic inverting circuit IQA, the P-type transistor PQA, and the N-type transistor NQA.

FIG. 13A is an example of driving capability in the case where control signals SNR8 to SNR10 have been made active. The driving capabilities of the driving units DR5 to DR10 on the most significant bit side are set to the same 6.25, and are lower than the driving capabilities of the driving units DR1 to DR4 on the least significant bit side. Specifically, the driving capabilities of the driving units DR1 to DR4 on the least significant bit side are set to decrease in order. The driving capabilities of the driving units DR5 to DR10 on the most significant bit side are set to lower values than a minimum value 12 of the driving capabilities of the driving units DR1 to DR4 on the least significant bit side.

The charge supply amounts from the capacitors C1 to C10 are greater on the most significant bit side, and thus the most significant bit side also contributes more to the voltage VQ. This is clear from Formula FE in FIG. 2A. In this embodiment, by setting the driving capability on the most significant bit side to be lower than the driving capability on the least significant bit side, the charge supply on the most significant bit side, which contributes more to the voltage VQ, can be delayed relative to the least significant bit side. Through this, the supply of charges from the capacitors on the most significant bit side is delayed (that is, the timings at which the charge supplies end are later than on the least significant bit side), and thus the charge supply peaks can be shifted and the peak value of the voltage VQ reduced. As a result, the chance that the power source voltage will be exceeded can be reduced.

To be more specific, a slope of a change in the output voltage of the driving unit DRi is represented by $dV/dt=(dQ/dt)/Ci=I/Ci$, and because a current I supplied to the capacitor Ci by the driving unit DRi is proportional to the transistor size, the slope $dV/dt$ is generally proportional to the ratio Di/Ci. In FIG. 13A, Di/Ci on the most significant bit side is low, and thus the slopes $dV/dt$ of the output voltages of the driving units that drive the capacitors having large charge supply amounts are low. Through this, the speed of the charge supplies from the capacitors having large charge supply amounts can be slowed, and the peak value of the voltage VQ can be reduced.

FIG. 13B is an example of driving capability in the case where control signals SNR8 to SNR10 have been made non-active. The driving capabilities of the driving units DR8 to DR10 that are capable of switching driving capability are set to half those in FIG. 13A, namely to 3.125. The driving capabilities of the driving units DR5 to DR7 remain at 6.25. In other words, the driving capabilities of the driving units DR8 to DR10 and the driving units DR5 to DR7 are the same, respectively, and of those, the driving capabilities of the driving units DR8 to DR10 on the most significant bit side are lower than the driving capabilities of the driving units DR5 to DR7. Of course, the driving capabilities of the driving units DR8 to DR10 are lower than the minimum value 12 of the driving capabilities of the driving units DR1 to DR4 on the least significant bit side.

By making it possible to switch the driving capabilities on the most significant bit side in this manner, the appropriate driving capabilities can be selected in accordance with the connection environment of the driver 100 (the type of the electro-optical panel 200, the design of a mounting board, and so on). This point will be described hereinafter.

A variety of electro-optical panels 200 (having different numbers of pixels, different types of liquid crystals, and so on, for example) can be connected to the driver 100 in this embodiment. The ratio between the capacitance C0 of the capacitor circuit 10 and the load-side capacitance CX+CP2 is 1:2, but the panel capacitance CP2 differs depending on the type of the electro-optical panel 200, and the capacitance CX changes in accordance therewith. The peak value of the output voltage VQ increases as the capacitance CX decreases, and thus it is easy for the peak value of the output voltage VQ to become high in the case where an electro-optical panel 200 having a high panel capacitance CP2 is connected. Conversely, it is easy for the peak value of the output voltage VQ to become low in the case where an electro-optical panel 200 having a low panel capacitance CP2 is connected.

With respect to this point, according to this embodiment, the configuration is such that the driving capabilities on the most significant bit side can be switched, and thus the optimal driving capability can be selected in accordance with the type of the electro-optical panel 200. For example, a low driving capability setting can be selected in the case where a high driving capability setting will cause the peak value of the output voltage VQ to exceed the power source voltage. Alternatively, a high driving capability setting can be selected in the case where a high driving capability setting will not cause the peak value of the output voltage VQ to exceed the power source voltage. In addition, although a high driving capability is desirable from the standpoint of realizing high-speed driving as described above, in this embodiment, the highest driving capability can be selected within a range where the peak value of the output voltage VQ does not exceed the power source voltage.

According to this embodiment as described thus far, in the case where the driving capabilities of the first to tenth driving units DR1 to DR10 are represented by D1 to D10 and the capacitances of the first to tenth capacitors C1 to C10 are represented by C1 to C10, the driving capability D10 of the tenth driving unit DR10 is set so that D10/C10<D1/C1. For example, in the example illustrated in FIG. 13A, D10/C10=6.25<96=D1/C1, and in the example illustrated in FIG. 13B, D10/C10=3.125<96=D1/C1.

As described above, the ratio Di/Ci between the driving capability Di and the capacitance of the capacitor Ci determines the slope in the change of the output voltage of the driving unit DRi. In this embodiment, by setting D10/C10 to be less than D1/C1, at least the slope of the change in the voltage that drives the capacitor C10 having the highest capacitance can be made lower than the slope of the change in the voltage that drives the capacitor C1 having the lowest capacitance. Through this, the speed of the supply of the charge from the capacitor C10 (that is, the current) having the greatest charge supply amount (that pushes the peak value of the output voltage VQ up the most) can be reduced, and thus the peak value of the output voltage VQ can be effectively reduced.

Although this embodiment describes a case where the driving capability is switched between two levels as an example, the configuration for making the driving capability variable is not limited thereto. For example, the configuration may be such that the driving capability can be switched among even more levels.

Here, the "driving capability" is the capability to drive a capacitor to be driven, and is a capability to supply a charge (a current) to the capacitor. The driving capability is expressed, for example, by the size of a transistor (an output stage, a final stage) that drives the capacitor, among the transistors that constitute the driving unit, an on resistance of that transistor, and so on.

In addition, in this embodiment, at least the tenth driving unit DR10 of the first to tenth driving units DR1 to DR10 is a driving unit whose driving capability is variable.

By providing the driving unit DR10 that drives the capacitor of the capacitors C1 to C10 having the highest capacitance with a variable driving capability, at least the driving capability of the driving unit DR10 that drives the capacitor C10 having the highest capacitance can be reduced. Through this, the peak value when the voltage VQ outputted through capacitive driving changes transiently can be reduced (or increased, in the case of negative-polarity driving). In other words, the capacitor C10, which has the highest capacitance of the capacitors C1 to C10, also supplies the greatest charge to the data voltage output node NVQ, and thus of the driving units DR1 to DR10, reducing the driving capability of the driving unit DR10 contributes the most to the reduction of the peak value of the output voltage VQ.

In addition, by making the driving capability variable, a high driving capability setting can be made within a range in which the peak value of the output voltage VQ does not exceed (or drop below, in the case of negative-polarity driving) the power source voltage. Through this, the optimal driving capability can be set in accordance with the connection environment of the driver 100. That is, the peak value of the output voltage VQ can be reduced (or increased, in the case of negative-polarity driving) while ensuring high-speed settling in the capacitive driving.

8. Third Example of Configuration of Driver

Next, consider again the data voltage in the first configuration example illustrated in FIG. 1. FIG. 2A assumes that the ratio between the capacitance CO of the capacitor circuit 10 and the electro-optical panel-side capacitance CP is set to 1:2, but a maximum value of the data voltage in cases also including cases where the ratio is not 1:2 will be considered. As will be described hereinafter, if the driver 100 is to be created in a generic manner so as to be applicable in a variety of electro-optical panels 200, the ratio cannot be kept at 1:2, leading to a problem that the data voltage cannot be outputted in a constant range.

As illustrated in FIG. 14A, first, the capacitor circuit 10 is reset. In other words, "000h" is set for the tone data GD[10:1] (the h at the end indicates that the number within the" is a hexadecimal) and all of the outputs of the driving units DR1 to DR10 are set to 0 V. Meanwhile, the voltage VQ is set to VC=7.5 V, as indicated by Formula FA in FIG. 14A. In this reset, the entire charge accumulated in the capacitance CO of the capacitor circuit 10 and the electro-optical panel-side capacitance CP is conserved in the following data voltage output. Through this, data voltage that takes a reset voltage VC (a common voltage) as a reference is outputted.

As illustrated in FIG. 14B, the maximum value of the data voltage is outputted in the case where the tone data GD[10:1] is set to "3FFh" and the outputs of all of the driving units DR1 to DR10 are set to 15 V. The data voltage at this time can be found from the principle of the conservation of charge, and is a value indicated by Formula FB in FIG. 14B.

As illustrated in FIG. 14C, a desired data voltage range is assumed to be 5 V, for example. Because the reset voltage VC of 7.5 V is the reference, the maximum value is 12.5 V. This data voltage is realized when, based on the Formula FB, CO/(CO+CP)=1/3. In other words, relative to the electro-optical panel-side capacitance CP, the capacitance CO of the capacitor circuit 10 may be set to CP/2 (in other words, CP=2CO). The 5 V data voltage range can be realized by designing CO to be equal to CP/2 in this manner for a specific electro-optical panel 200 and a mounting board.

However, depending on the type of the electro-optical panel 200, the design of the mounting board, and so on, the electro-optical panel-side capacitance CP has a range of approximately 50 pF to 120 pF. Meanwhile, even with the same types of electro-optical panel 200 and mounting board, in the case where a plurality of electro-optical panels are connected (when connecting three R, G, and B electro-optical panels in a projector, for example), the lengths of wires for connecting the respective electro-optical panels to drivers differ, and thus the board capacitance CP1 will not necessary be the same.

For example, assume that the design is such that the capacitance CO of the capacitor circuit 10 for a given electro-optical panel 200 and mounting board is CP=2CO. In the case where a different type of electro-optical panel or mounting board is connected to this capacitor circuit 10, CP may become CO/2, 5CO, or the like. In the case where CP=CO/2, the maximum value of the data voltage will become 17.5 V, exceeding the power source voltage of 15 V, as illustrated in FIG. 14C. In this case, there is a problem not only in terms of the data voltage range but also in terms of the breakdown voltages of the driver 100, the electro-optical panel 200, and so on. Meanwhile, in the case where CP=5CO, the maximum value of the data voltage is 10 V, and thus a sufficient data voltage range cannot be achieved.

As such, in the case where the capacitance CO of the capacitor circuit 10 is set in accordance with the electro-optical panel-side capacitance CP, there is an issue that a dedicated design is necessary for the driver 100 with respect to the electro-optical panel 200, the mounting board, or the like. In other words, each time the type of the electro-optical panel 200, the design of the mounting board, or the like is changed, it is necessary to redesign the driver 100 specifically therefor.

FIG. 15 illustrates a third example of the configuration of a driver according to this embodiment, capable of solving the stated problem. This driver 100 includes the capacitor circuit 10, the capacitor driving circuit 20, and the variable capacitance circuit 30. Note that constituent elements that are the same as constituent elements already described are assigned the same reference numerals, and descriptions of those constituent elements are omitted as appropriate.

The variable capacitance circuit 30 is a circuit, serving as a capacitance connected to the data voltage output node NVQ, whose capacitance value can be set in a variable manner. Specifically, the variable capacitance circuit 30 includes first to mth switching elements SWA1 to SWAm (where m is a natural number of 2 or more), and first to mth adjusting capacitors CA1 to CAm. Note that the following will describe an example in which m=6.

The first to sixth switching elements SWA1 to SWA6 are configured as, for example, P-type or N-type MOS transistors, or as transfer gates that combine a P-type MOS transistor and an N-type MOS transistor. Of the switching elements SWA1 to SWA6, one end of an sth switching element SWAs (where s is a natural number no greater than m, which is 6) is connected to the data voltage output node NVQ.

The first to sixth adjusting capacitors CA1 to CA6 have capacitance values weighted by a power of 2. Specifically, of the adjusting capacitors CA1 to CA6, an sth adjusting capacitor CAs has a capacitance value of $2^{(s-1)} \times CA1$. One end of the sth adjusting capacitor CAs is connected to another end of the sth switching element SWAs. Another end of the sth adjusting capacitor CAs is connected to a low-potential side power source (broadly defined as a reference voltage node).

For example, in the case where CA1 is set to 1 pF, the capacitance of the variable capacitance circuit 30 is 1 pF while only the switching element SWA1 is on, whereas the capacitance of the variable capacitance circuit 30 is 63 pF (=1 pF+2 pF+ . . . +32 pF) while all the switching elements SWA1 to SWA6 are on. Because the capacitance values are weighted by a power of 2, the capacitance of the variable capacitance circuit 30 can be set from 1 pF to 63 pF in 1 pF (CA1) steps in accordance with whether the switching elements SWA1 to SWA6 are on or off.

9. Data Voltages in Third Configuration Example

Data voltages outputted by the driver 100 according to this embodiment will be described. Here, a range of the data voltages (a data voltage maximum value) will be described.

As illustrated in FIG. 16A, first, the capacitor circuit 10 is reset. In other words, the outputs of all the driving units DR1 to DR10 are set to 0 V and the voltage VQ is set to VC=7.5 V (Formula FC). In this reset, the entire charge accumulated in the capacitance CO of the capacitor circuit 10, a capacitance CA of the variable capacitance circuit, and the electro-optical panel-side capacitance CP is conserved in the following data voltage output.

As illustrated in FIG. 16B, the maximum value of the data voltage is outputted in the case where the outputs of all of the driving units DR1 to DR10 are set to 15 V. The data voltage in this case is a value indicated by Formula FD in FIG. 16B.

As illustrated in FIG. 16C, a desired data voltage range is assumed to be 5 V, for example. The maximum value of 12.5 V for the data voltage is realized in the case where, from Formula FD, CO/(CO+(CA+CP))=⅓, or in other words, in the case where CA+CP=2CO. CA is the capacitance of the variable capacitance circuit, and can thus be set freely, which in turn means that the CA can be set to 2CO−CP for the provided CP. In other words, regardless of the type of the electro-optical panel 200 connected to the driver 100, the design of the mounting board, or the like, the data voltage range can always be set to 7.5 V to 12.5 V.

According to the third configuration example described thus far, the driver 100 includes the variable capacitance circuit 30. The variable capacitance circuit 30 is provided between the data voltage output terminal TVQ and a node at a reference voltage (the voltage of the low-potential side power source, namely 0 V). Then, the capacitance CA of the variable capacitance circuit 30 is set so that a capacitance CA+CP obtained by adding the capacitance CA of the variable capacitance circuit 30 and the electro-optical panel-side capacitance CP (this will be called a "driven-side capacitance" hereinafter) and the capacitance CO of the capacitor circuit 10 (this will be called a "driving-side capacitance" hereinafter) have a prescribed capacitance ratio relationship (CO:(CA+CP)=1:2, for example).

Here, the capacitance CA of the variable capacitance circuit 30 is a capacitance value set for the variable capacitance of the variable capacitance circuit 30. In the example of FIG. 15, this is obtained by taking the total of the capacitances of the adjusting capacitors connected to switching elements, of the switching elements SWA1 to SWA6, that are on. Meanwhile, the electro-optical panel-side capacitance CP is a capacitance externally connected to the data voltage output terminal TVQ (parasitic capacitance, circuit element capacitance). In the example illustrated in FIG. 15, this is the board capacitance CP1 and the panel capacitance CP2. Meanwhile, the capacitance CO of the capacitor circuit 10 is the total of the capacitances of the capacitors C1 to C10.

The prescribed capacitance ratio relationship refers to a relationship in a ratio between the driving-side capacitance CO and the driven-side capacitance CA+CP. This is not limited to a capacitance ratio in the case where the values of each capacitance are measured (where the capacitance values are explicitly determined). For example, the capacitance ratio may be estimated from the output voltage VQ for prescribed tone data GD[10:1]. The electro-optical panel-side capacitance CP is normally not a measured value obtained in advance, and thus the capacitance CA of the variable capacitance circuit 30 cannot be determined directly. Accordingly, as will be described later with reference to FIG. 19, the capacitance CA of the variable capacitance circuit 30 is determined so that, for example, a VQ of 10 V is outputted for a median value "200h" of the tone data GD[10:1]. In this case, the capacitance ratio is ultimately estimated as being CO:(CA+CP)=1:2, and the capacitance CP can be estimated from this ratio and the capacitance CA (can be estimated, but the capacitance CP need not be known).

In the first configuration example illustrated in FIG. 1 and the like, there is an issue in that a design change is necessary each time the connection environment of the driver 100 (the design of the mounting board, the type of the electro-optical panel 200, or the like) changes.

With respect to this point, according to the third configuration example, a generic driver 100 that does not depend on the connection environment of the driver 100 can be realized by providing the variable capacitance circuit 30. In other words, even in the case where the electro-optical panel-side capacitance CP is different, the prescribed capacitance ratio relationship (for example, CO:(CA+CP)=1:2) can be realized by adjusting the capacitance CA of the variable capacitance circuit 30 in accordance therewith. The data voltage range (7.5 V to 12.5 V in the example illustrated in FIGS. 16A to 16C) is determined by this capacitance ratio relationship, and thus a data voltage range that does not depend on the connection environment can be realized.

In addition, in this embodiment, the capacitor driving circuit 20 outputs the first voltage level (0 V) or the second voltage level (15 V) as driving voltages corresponding to the respective first to tenth capacitor driving voltages, based on the first to tenth bits GD1 to GD10 of the tone data GD[10:1]. The prescribed capacitance ratio relationship is determined by a voltage relationship between a voltage difference between the first voltage level and the second voltage level (15 V) and the data voltage outputted to the data voltage output terminal TVQ (the output voltage VQ).

In the example illustrated in FIGS. 16A to 16C, the range of data voltages outputted to the data voltage output terminal TVQ is 5 V (7.5 V to 12.5 V), for example. In this case, the prescribed capacitance ratio relationship is determined so that the voltage relationship is realized between the voltage difference between the first voltage level and the second voltage level (15 V) and the data voltage range (5 V). In other words, a capacitance ratio of CO:(CA+CP)–1:2 at which 15 V is divided to 5 V through voltage division by the capacitance CO and the capacitance CA+CP becomes the prescribed capacitance ratio relationship.

By doing so, the prescribed capacitance ratio relationship of CO:(CA+CP)=1:2 can be determined from the voltage relationship between the voltage difference between the first voltage level and the second voltage level (15 V) and the range of data voltages outputted to the data voltage output terminal TVQ (a range of 5 V). Conversely, whether or not the prescribed capacitance ratio relationship is realized can be determined by examining the voltage relationship. In other words, even if the electro-optical panel-side capacitance CP is not known, the capacitance CA of the variable capacitance circuit 30 at which the capacitance ratio of CO:(CA+CP)=1:2 is realized can be determined from the voltage relationship (the flow illustrated in FIG. 19, for example).

10. Detailed Example of Configuration of Driver

Figure 17:
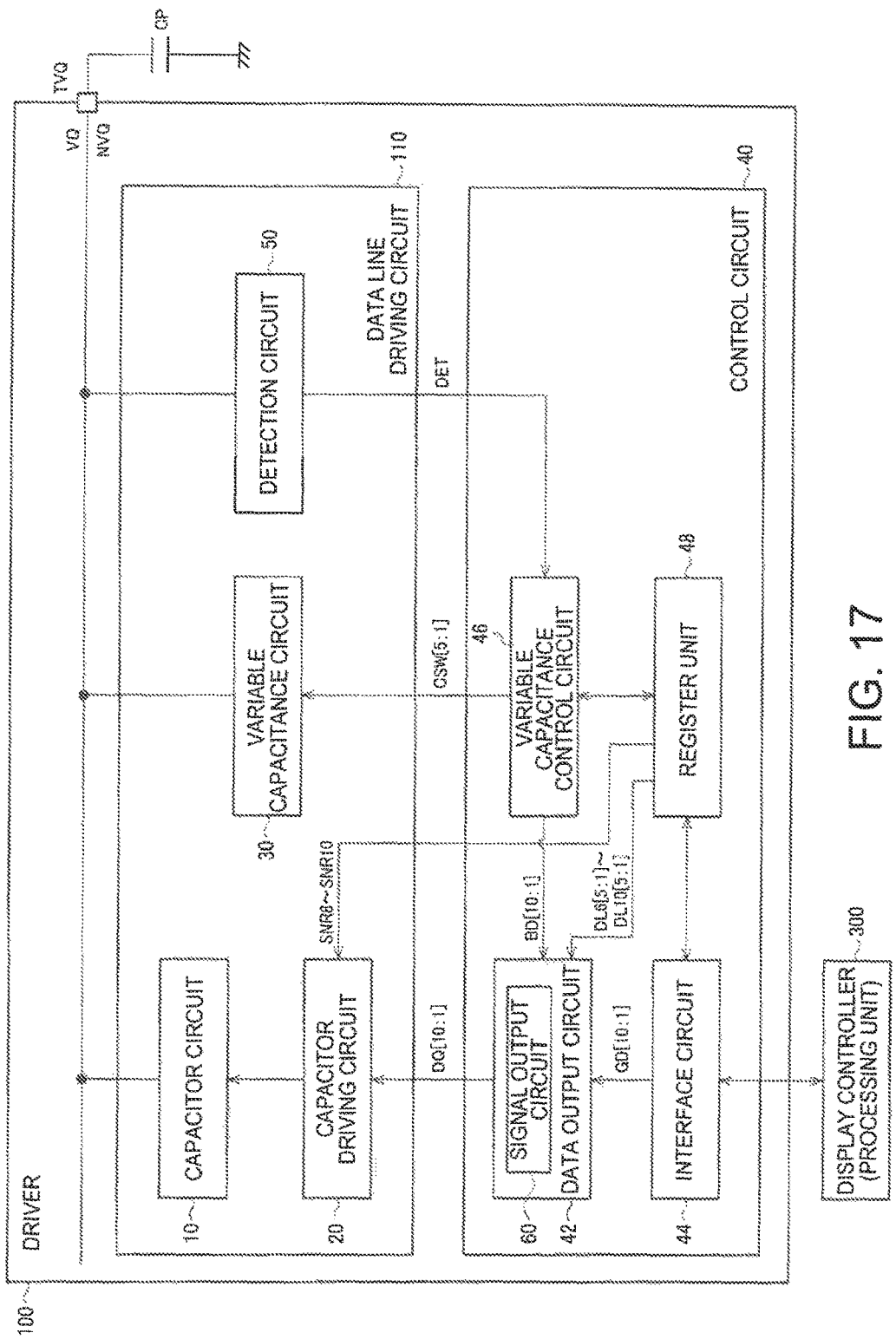
FIG. 17 illustrates an example of the detailed configuration of a driver.

FIG. 17 illustrates a detailed example of the configuration of the driver according to this embodiment. This driver 100 includes a data line driving circuit 110 and the control circuit 40. The data line driving circuit 110 includes the capacitor circuit 10, the capacitor driving circuit 20, the variable capacitance circuit 30, and a detection circuit 50. The control circuit 40 includes a data output circuit 42, an interface circuit 44, a variable capacitance control circuit 46, and a register unit 48 (a storage unit). The data output circuit 42 includes the signal output circuit 60. Note that constituent elements that are the same as constituent elements already described are assigned the same reference numerals, and descriptions of those constituent elements are omitted as appropriate.

A single data line driving circuit 110 is provided corresponding to a single data voltage output terminal TVQ. Although the driver 100 includes a plurality of data line driving circuits and a plurality of data voltage output terminals, only one is illustrated in FIG. 17.

The interface circuit 44 carries out an interfacing process between a display controller 300 (broadly defined as a processing unit) that controls the driver 100 and the driver 100. For example, the interfacing process is carried out on serial communication such as LVDS (Low Voltage Differential Signaling) or the like. In this case, the interface circuit 44 includes an I/O circuit that inputs/outputs serial signals and a serial/parallel conversion circuit that carries out serial/parallel conversion on control data, image data, and so on. Meanwhile, a line latch that latches the image data inputted from the display controller 300 and converted into parallel data is also included. The line latch latches image data corresponding to a single horizontal scanning line at one time, for example.

The data output circuit 42 extracts the tone data GD[10:1] to be outputted to the capacitor driving circuit 20 from the image data corresponding to the horizontal scanning line, and outputs this data as data DQ[10:1]. At this time, the signal output circuit 60 delays the outputs of the respective bits of the data DQ[10:1]. The data output circuit 42 includes, for example, a timing controller that controls a driving timing of the electro-optical panel 200, a selection circuit that selects the tone data GD[10:1] from the image data corresponding to the horizontal scanning line, and an output latch that latches the selected tone data GD[10:11] as the data DQ[10:1] (the latch unit 62 of the signal output circuit 60). As will be described later with reference to FIG. 21 and so on, in the case of phase expansion driving, the output latch latches eight pixels' worth of the tone data GD[10:1] (equivalent to the number of data lines DL1 to DL8) at one time (in other words, the output latch includes eight latch units 62). In this case, the timing controller controls the operational timing of the selection circuit, the output latch, and so on in accordance with the driving timing of the phase expansion driving. Meanwhile, a horizontal synchronization signal, a vertical synchronization signal, and so on may be generated based on the image data received by the interface circuit 44. Furthermore, a signal (ENBX) for controlling the switching elements (SWEP1 and the like) in the electro-optical panel 200 on and off, a signal for controlling gate driving (selection of horizontal scanning lines in the electro-optical panel 200), and so on may be outputted to the electro-optical panel 200.

The detection circuit 50 detects the voltage VQ at the data voltage output node NVQ. Specifically, the detection circuit 50 compares a prescribed detection voltage with the voltage VQ and outputs a result thereof as a detection signal DET. For example, DET="1" is outputted in the case where the voltage VQ is greater than or equal to the detection voltage, and DET="0" is outputted in the case where the voltage VQ is less than the detection voltage.

The variable capacitance control circuit 46 sets the capacitance of the variable capacitance circuit 30 based on the detection signal DET. The flow of this setting process will be described later with reference to FIG. 19. The variable capacitance control circuit 46 outputs a setting value CSW[6:1] as a control signal for the variable capacitance circuit 30. This setting value CSW[6:1] is constituted of first to sixth bits CSW6 to CSW1 (first to mth bits). A bit CSWs (where s is a natural number no greater than m, which is 6) is inputted into the switching element SWAs of the variable capacitance circuit 30. For example, in the case where the bit CSWs="0", the switching element SWAs turns off, whereas in the case where the bit CSWs="1", the switching element SWAs turns on. In the case where the setting process is carried out, the variable capacitance control circuit 46 outputs detection data BD[10:1]. Then, the data output circuit 42 outputs the detection data BD[10:1] to the capacitor driving circuit 20 as the output data DQ[10:1].

The register unit 48 stores the setting value CSW[6:1] of the variable capacitance circuit 30 set through the setting process, setting values DY6 [5:1] to DY10[5:1] that set the delay times of the signal output circuit 60, and setting values (the control signals SNR8 to SNR10) that set the driving capabilities of the driving units DR8 to DR10 on the most significant bit side in the capacitor driving circuit 20. In addition, the register unit 48 is configured to be accessible from the display controller 300 via the interface circuit 44. In other words, the display controller 300 can read out and write the setting values CSW[6:1], DY6[5:1] to DY10[5:1], and SNR8 to SNR10 through the register unit 48.

Figure 18:
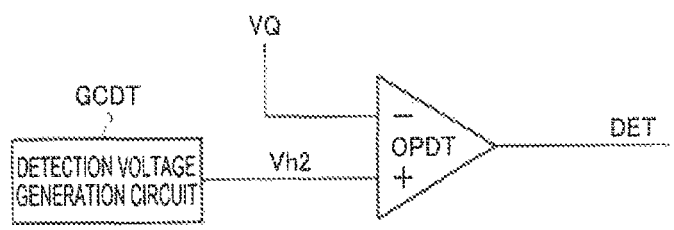
FIG. 18 illustrates an example of the detailed configuration of a detection circuit.

FIG. 18 illustrates an example of the detailed configuration of the detection circuit 50. The detection circuit 50 includes a detection voltage generation circuit GCDT that generates a detection voltage Vh2 and a comparator OPDT that compares the voltage VQ at the data voltage output node NVQ with the detection voltage Vh2.

The detection voltage generation circuit GCDT outputs the predetermined detection voltage Vh2 by a circuit such as a voltage division circuit using a resistance element, for example. Alternatively, a variable detection voltage Vh2 may be outputted through register settings or the like. In this case, the detection voltage generation circuit GCDT may be a D/A conversion circuit that D/A-converts a register setting value.

11. Process for Setting Capacitance of Variable Capacitance Circuit

Figure 19:
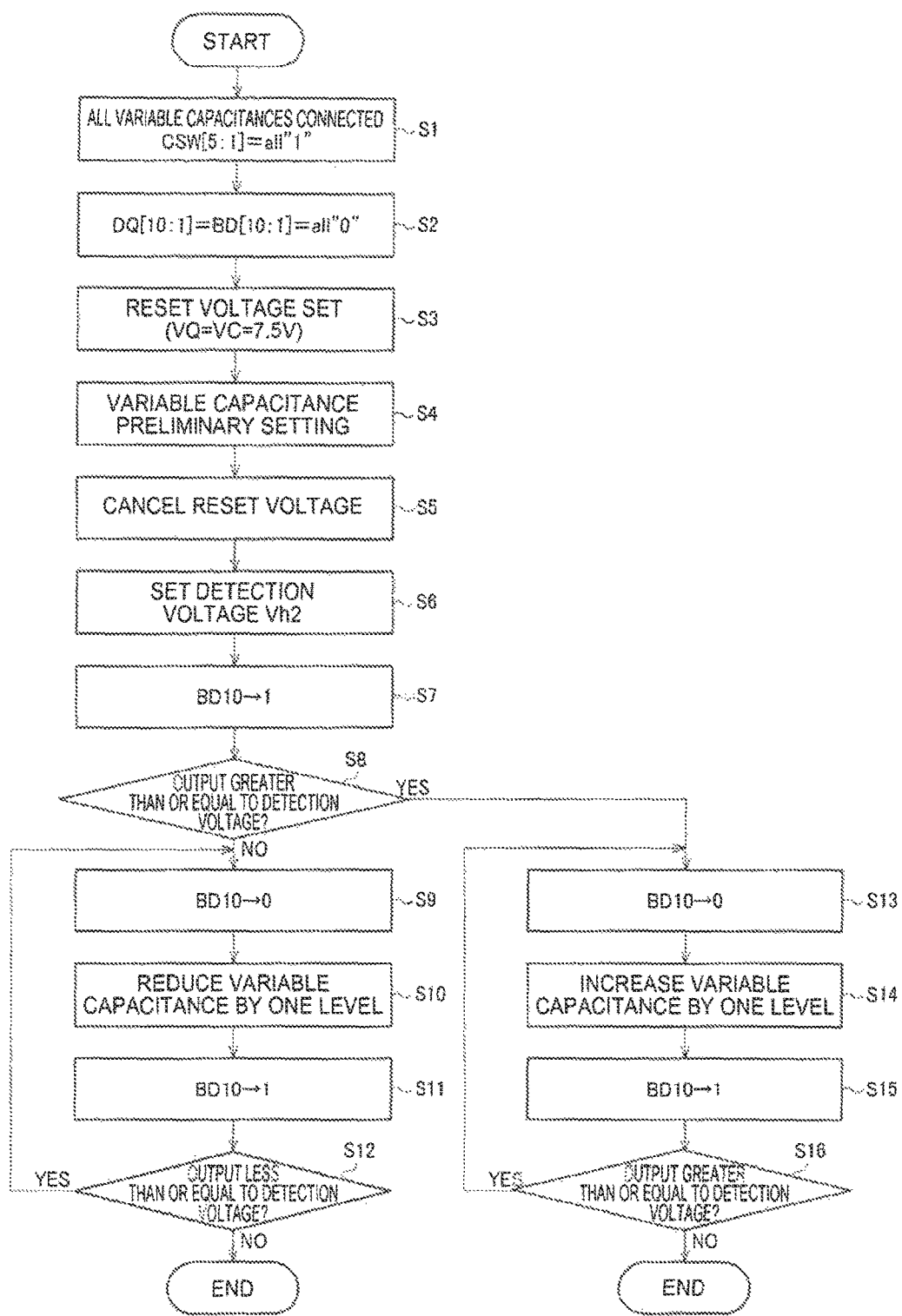
FIG. 19 is a flowchart illustrating a process for setting a capacitance of a variable capacitance circuit.

FIG. 19 is a flowchart illustrating a process for setting the capacitance of the variable capacitance circuit 30. This process is carried out, for example, during startup (an initialization process) when the power of the driver 100 is turned on.

As illustrated in FIG. 19, when the process starts, the setting value CSW[6:1] of "3Fh" is outputted, and all of the switching elements SWA1 to SWA6 of the variable capacitance circuit 30 are turned on (step S1). Next, the detection data BD[10:1] of "000h" is outputted, and the outputs of all of the driving units DR1 to DR10 of the capacitor driving circuit 20 are set to 0 V (step S2). Next, the output voltage VQ is set to the reset voltage VC of 7.5 V (step S3). This reset voltage VC is supplied, for example, from the exterior via a terminal TVC.

Next, the capacitance of the variable capacitance circuit 30 is preliminarily set (step S4). For example, the setting value CSW[6:1] is set to "1Fh". In this case, the switching element SWA6 turns off and the switching elements SWA5 to SWA1 turn on, and thus the capacitance is half the maximum value. Next, the supply of the reset voltage VC to the output voltage VQ is canceled (step S5). Then, the detection voltage Vh2 is set to a desired voltage (step S6). For example, the detection voltage Vh2 is set to 10 V.

Next, the MSB of the detection data BD[10:1] is changed from BD10="0" to BD10="1" (step S7). Then, it is detected whether or not the output voltage VQ is greater than or equal to the detection voltage Vh2 of 10 V (step S8).

In the case where the output voltage VQ is less than the detection voltage Vh2 of 10 V in step S8, the bit BD10 is returned to "0" (step S9). Next, 1 is subtracted from the setting value CSW[6:1] of "1Fh" for "1Eh" and the capacitance of the variable capacitance circuit 30 is lowered by one level (step S10). Next, the bit BD10 is set to "1" (step S11). Then, it is detected whether or not the output voltage VQ is less than or equal to the detection voltage Vh2 of 10 V (step S12). The process returns to step S9 in the case where the output voltage VQ is less than or equal to the detection voltage Vh2 of 10 V, and the process ends in the case where the output voltage VQ is greater than the detection voltage Vh2 of 10 V.

In the case where the output voltage VQ is greater than or equal to the detection voltage Vh2 of 10 V in step S8, the bit BD10 is returned to "0" (step S13). Next, 1 is added to the setting value CSW[6:1] of "1Fh" for "20h" and the capacitance of the variable capacitance circuit 30 is raised by one level (step S14). Next, the bit BD10 is set to "1" (step S15). Then, it is detected whether or not the output voltage VQ is greater than or equal to the detection voltage Vh2 of 10 V (step S16). The process returns to step S13 in the case where the output voltage VQ is greater than or equal to the detection voltage Vh2 of 10 V, and the process ends in the case where the output voltage VQ is less than the detection voltage Vh2 of 10 V.

FIGS. 20A and 20B schematically illustrate the setting value CSW[6:1] being determined through the stated steps S8 to S16.

In the aforementioned flow, the MSB of the detection data BD[10:1] is set to BD10="1", and the output voltage VQ at that time is compared to the detection voltage Vh2 of 10 V. BD[10:1]="200h" is a median value of the tone data range "000h" to "3FFh", and the detection voltage Vh2 of 10 V is a median value of the data voltage range of 7.5 V to 12.5 V. In other words, if the output voltage VQ matches the detection voltage Vh2 of 10 V when BD10="1", the correct (desired) data voltage is obtained.

As illustrated in FIG. 20A, in the case of "NO" in step S8 for the preliminary setting value CSW[6:1]="1Fh", VQ<Vh2. In this case, it is necessary to raise the output voltage VQ. From Formula FD in FIG. 16B, it can be seen that the output voltage VQ will rise if the capacitance CA of the variable capacitance circuit 30 is reduced, and thus the setting value CSW[6:1] is reduced by "1" at a time. The setting value CSW[6:1] stops at "1Ah", where VQ≥Vh2 for the first time. Through this, the setting value CSW[6:1] at which the output voltage VQ nearest to the detection voltage Vh2 is obtained can be determined.

As illustrated in FIG. 20B, in the case of "YES" in step S8 for the preliminary setting value CSW[6:1]"1Fh", VQ≥Vh2. In this case, it is necessary to lower the output voltage VQ. From Formula FD in FIG. 16B, it can be seen that the output voltage VQ will drop if the capacitance CA of the variable capacitance circuit 30 is increased, and thus the setting value CSW[6:1] is increased by "1" at a time. The setting value CSW[6:1] stops at "24h", where VQ<Vh2 for the first time. Through this, the setting value CSW[6:1] at which the output voltage VQ nearest to the detection voltage Vh2 is obtained can be determined.

The setting value CSW[6:1] obtained through the above processing is determined as the final setting value CSW[6:1], and that setting value CSW[6:1] is written into the register unit 48. When driving the electro-optical panel 200 through capacitive driving, the capacitance of the variable capacitance circuit 30 is set using the setting value CSW[6:1] stored in the register unit 48.

Although this embodiment describes an example in which the setting value CSW[6:1] of the variable capacitance circuit 30 is stored in the register unit 48, the invention is not limited thereto. For example, the setting value CSW[6:1] may be stored in a memory such as a RAM or the like, or the setting value CSW[6:1] may be set using a fuse (for example, setting the setting value through cutting by a laser or the like during manufacture).

12. Phase Expansion Driving Method

Next, a method of driving the electro-optical panel 200 will be described. The following describes an example of phase expansion driving, but the method of driving carried out by the driver 100 in this embodiment is not limited to phase expansion driving.

Figure 21:
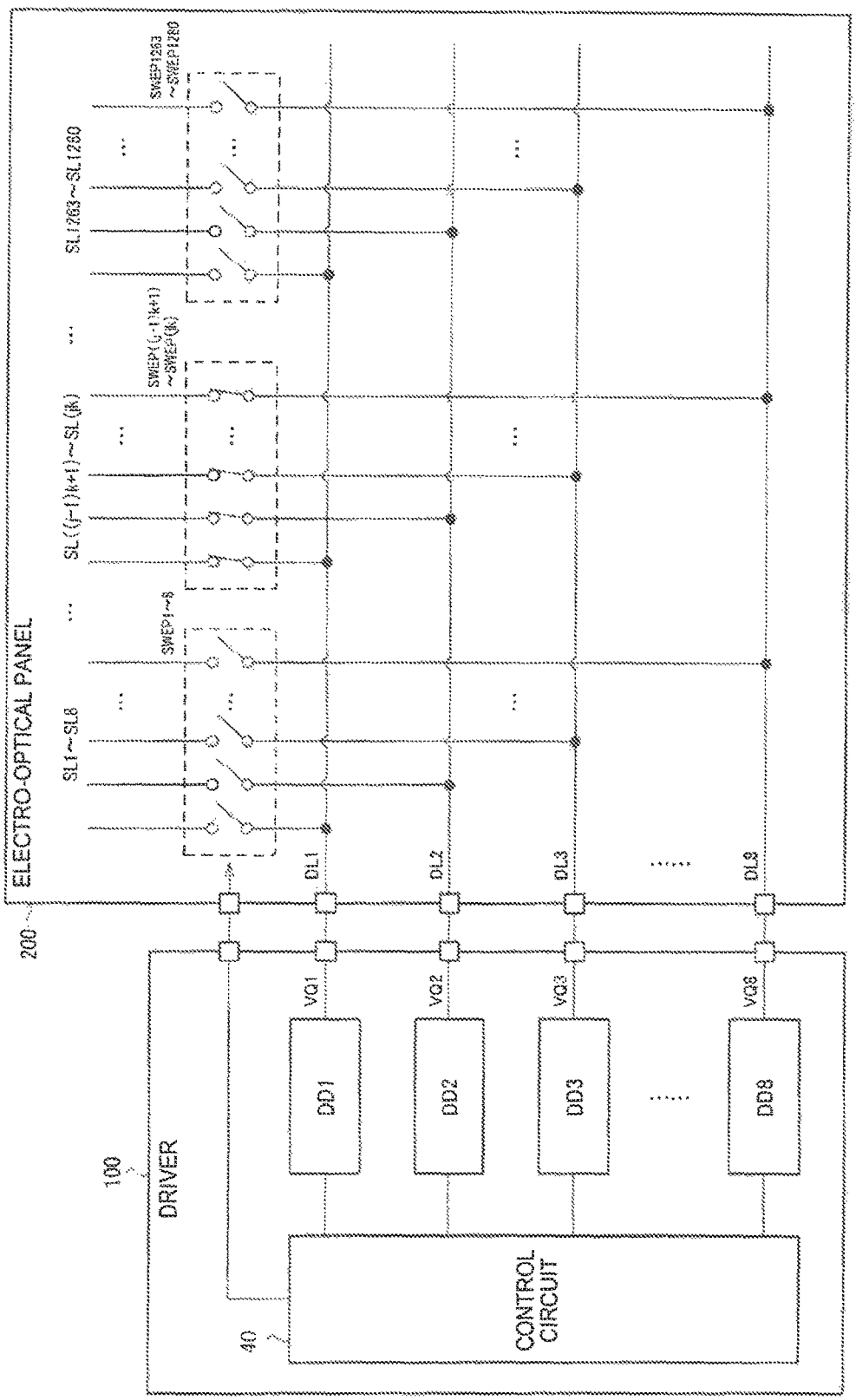
FIG. 21 illustrates a second example of the detailed configuration of a driver, an example of the detailed configuration of an electro-optical panel, and an example of the configuration of connections between the driver and the electro-optical panel.

FIG. 21 illustrates a second example of the detailed configuration of a driver, an example of the detailed configuration of an electro-optical panel, and an example of the configuration of connections between the driver and the electro-optical panel.

The driver 100 includes the control circuit 40 and first to kth data line driving circuits DD1 to DDk (where k is a natural number of 2 or more). The data line driving circuits DD1 to DDk each correspond to the data line driving circuit 110 illustrated in FIG. 17. Note that the following will describe an example in which k=8.

The control circuit 40 outputs tone data corresponding to of the data line driving circuits DD1 to DD8. The control circuit 40 also outputs a control signal (for example, ENBX illustrated in FIG. 22 or the like) to the electro-optical panel 200.

The data line driving circuits DD1 to DD8 convert the tone data into data voltages, and output those data voltages to the data lines DL1 to DL8 of the electro-optical panel 200 as output voltages VQ1 to VQ8.

The electro-optical panel 200 includes the data lines DL1 to DL8 (first to kth data lines), switching elements SWEP1 to SWEP(tk), and source lines SL1 to SL(tk). t is a natural number of 2 or more, and the following will describe an example in which t=160 (in other words, tk=160×8=1,280 (WXGA)).

Of the switching elements SWEP1 to SWEP1280, one end of each of the switching elements SWEP((j−1)×k+1) to SWEP(j×k) is connected to the data lines DL1 to DL8. j is a natural number no greater than t, which is 160. For example, in the case where j=1, the switching elements are SWEP1 to SWEP8.

The switching elements SWEP1 to SWEP1280 are constituted of TFTs (Thin Film Transistors) or the like, for example, and are controlled based on control signals from the driver 100. For example, the electro-optical panel 200 includes a switching control circuit (not shown), and that switching control circuit controls the switching elements SWEP1 to SWEP1280 to turn on and off based on a control signal such as ENBX.

Figure 22:
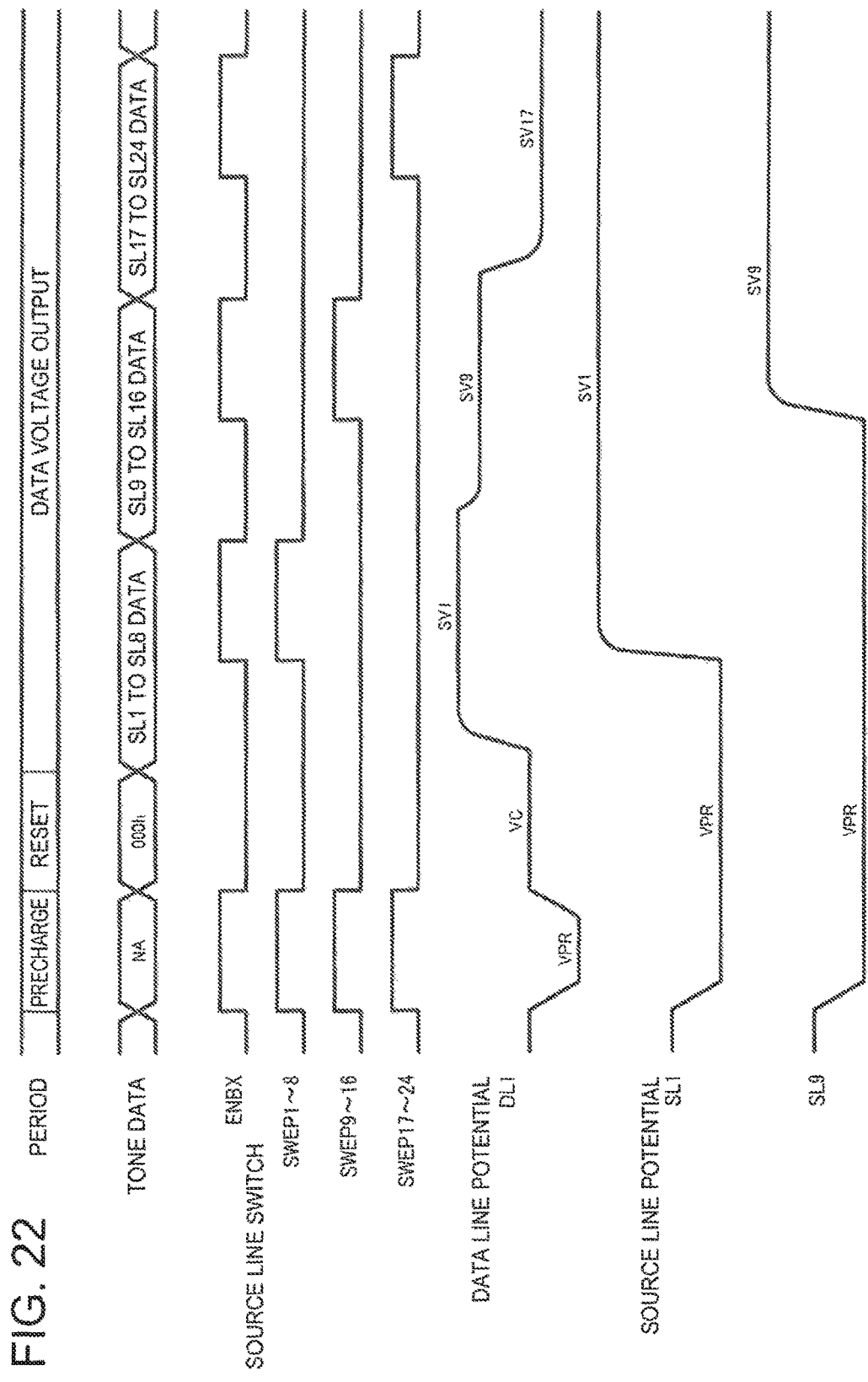
FIG. 22 is an operational timing chart of a driver and an electro-optical panel.

FIG. 22 is an operational timing chart of the driver 100 and the electro-optical panel 200 illustrated in FIG. 21.

In a precharge period, the signal ENBX goes to high-level, and all of the switching elements SWEP1 to SWEP1280 turn on. Then, all of the source lines SL1 to SL1280 are set to a precharge voltage VPR.

In a reset period, the signal ENBX goes to low-level, and the switching elements SWEP1 to SWEP1280 all turn off. The data lines DL1 to DL8 are then set to the reset voltage VC of 7.5 V. The source lines SL1 to SL1280 remain at the precharge voltage VPR.

In a first output period in a data voltage output period, the tone data corresponding to the source lines SL1 to SL8 are inputted into the data line driving circuits DD1 to DD8. Then, capacitive driving is carried out by the capacitor circuit 10 and the capacitor driving circuit 20 and voltage driving is carried out by a voltage driving circuit 80, and the data lines DL1 to DL8 are driven by the data voltages SV1 to SV8. After the capacitive driving and voltage driving start, the signal ENBX goes to high-level, and the switching elements SWEP1 to SWEP8 turn on. Then, the source lines SL1 to SL8 are driven by the data voltages SV1 to SV8. At this time, a single gate line (horizontal scanning line) is selected by a gate driver (not shown), and the data voltages SV1 to SV8 are written into the pixel circuits connected to the selected gate line and the data lines DL1 to DL8. Note that FIG. 18 illustrates potentials of the data line DL1 and the source line SL1 as examples.

In a second output period, the tone data corresponding to the source lines SL9 to SL16 are inputted into the data line driving circuits DD1 to DD8. Then, capacitive driving is carried out by the capacitor circuit 10 and the capacitor driving circuit 20 and voltage driving is carried out by the voltage driving circuit 80, and the data lines DL1 to DL8 are driven by the data voltages SV9 to SV16. After the capacitive driving and voltage driving start, the signal ENBX goes to high-level, and the switching elements SWEP9 to SWEP16 turn on. Then, the source lines SL9 to SL16 are driven by the data voltages SV9 to SV16. At this time, data voltages SV9 to SV16 are written into the pixel circuits connected to the selected gate line and the data lines DL9 to DL16. Note that FIG. 20 illustrates potentials of the data line DL1 and the source line SL9 as examples.

Thereafter, the source lines SL17 to SL24, SL25 to SL32, . . . , and SL1263 to SL1280 are driven in the same manner in a third output period, a fourth output period, . . . , and a 160th output period, after which the process moves to the postcharge period.

13. Electronic Device

Figure 23:
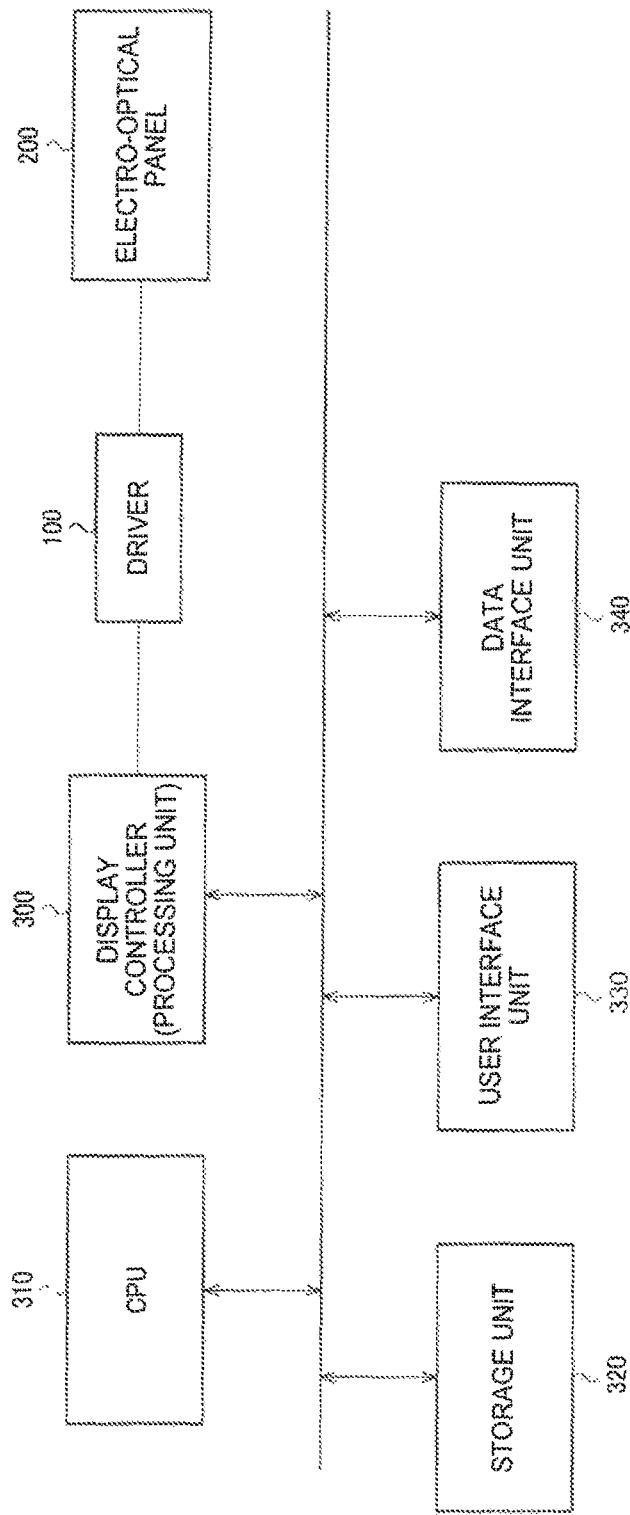
FIG. 23 illustrates an example of the configuration of an electronic device.

FIG. 23 illustrates an example of the configuration of an electronic device in which the driver 100 according to this embodiment can be applied. A variety of electronic devices provided with display devices can be considered as the electronic device according to this embodiment, including projector, a television device, an information processing apparatus (a computer), a mobile information terminal, a car navigation system, a mobile gaming terminal, and so on, for example.

The electronic device illustrated in FIG. 23 includes the driver 100, the electro-optical panel 200, the display controller 300 (a first processing unit), a CPU 310 (a second processing unit), a storage unit 320, a user interface unit 330, and a data interface unit 340.

The electro-optical panel 200 is a matrix-type liquid-crystal display panel, for example. Alternatively, the electro-optical panel 200 may be an EL (Electro-Luminescence) display panel using selfluminous elements. The user interface unit 330 is an interface unit that accepts various operations from a user. The user interface unit 330 is constituted of buttons, a mouse, a keyboard, a touch panel with which the electro-optical panel 200 is equipped, or the like, for example. The data interface unit 340 is an interface unit that inputs and outputs image data, control data, and the like. For example, the data interface unit 340 is a wired communication interface such as USB, a wireless communication interface such as a wireless LAN, or the like. The storage unit 320 stores image data inputted from the data interface unit 340. Alternatively, the storage unit 320 functions as a working memory for the CPU 310, the display controller 300, or the like. The CPU 310 carries out control processing for the various units in the electronic device, various types of data processing, and so on. The display controller 300 carries out control processing for the driver 100. For example, the display controller 300 converts image data transferred from the data interface unit 340, the storage unit 320, or the like into a format that can be handled by the driver 100, and outputs the converted image data to the driver 100. The driver 100 drives the electro-optical panel 200 based on the image data transferred from the display controller 300.

Although the foregoing has described embodiments of the invention in detail, one skilled in the art will easily recognize that many variations can be made thereon without departing from the essential spirit of the novel items and effects of the invention. Such variations should therefore be taken as being included within the scope of the invention. For example, in the specification or drawings, terms denoted at least once along with terms that have broader or the same definitions as those terms ("low-level" and "high-level" for "first logic level" and "second logic level", respectively) can be replaced with those terms in all areas of the specification or drawings. Furthermore, all combinations of the embodiments and variations fall within the scope of the invention. Finally, the configurations and operations of the capacitor circuit, capacitor driving circuit, signal output circuit, variable capacitance circuit, detection circuit, control circuit, driver, electro-optical panel, and electronic device are not limited to those described in the embodiments, and many variations can be made thereon.

The entire disclosure of Japanese Patent Application No. 2014-246532, filed Dec. 5, 2014 is expressly incorporated by reference herein.

What is claimed is:

1. A driver comprising:
a capacitor driving circuit that outputs first to nth capacitor driving voltages corresponding to tone data to first to nth capacitor driving nodes, n being a natural number of 2 or more;
a capacitor circuit including first to nth capacitors provided between the first to nth capacitor driving nodes and a data voltage output terminal;
a variable capacitance circuit provided between the data voltage output terminal and a reference voltage node; and
a variable capacitance control circuit that sets a capacitance of the variable capacitance circuit so that a capacitance obtained by adding a capacitance of the variable capacitance circuit and an electro-optical panel-side capacitance is in a prescribed capacitance ratio relationship with a capacitance of the capacitor circuit.

2. The driver according to claim 1, further comprising:
a detection circuit that detects a voltage at the data voltage output terminal and outputs a detection signal,
wherein the variable capacitance control circuit sets the capacitance of the variable capacitance circuit based on the detection signal.

3. An electronic device comprising the driver according to claim 2.

4. The driver according to claim 1, further comprising:
a detection circuit that detects a voltage at the data voltage output terminal and outputs a detection signal,
wherein the variable capacitance control circuit sets the capacitance of the variable capacitance circuit based on the detection signal and outputs a setting value of the variable capacitance circuit, the setting value of the variable capacitance circuit being stored in a register.

5. An electronic device comprising the driver according to claim 4.

6. The driver according to claim 1,
wherein the variable capacitance circuit includes first to sth capacitors, s being a natural number of 2 or more, and first to sth switching elements, each of the first to sth capacitors being provided between each of the first to sth switching elements and the reference voltage node, and the first to sth switching elements being provided between the data voltage output terminal and each of the first to sth capacitors.

7. The driver according to claim 6,
wherein the variable capacitance control circuit controls on and off of the switching elements.

8. The driver according to claim 7, further comprising:
a detection circuit that detects a voltage at the data voltage output terminal and outputs a result thereof as a detection signal,
wherein the variable capacitance control circuit controls on and off of the switching elements based on the detection signal.

9. An electronic device comprising the driver according to claim 8.

10. The driver according to claim 7, further comprising:
a detection circuit that detects a voltage at the data voltage output terminal and outputs a result thereof as a detection signal,
wherein the variable capacitance control circuit controls on and off of the switching elements based on the detection signal and outputs a setting value of the variable capacitance circuit, the setting value of the variable capacitance circuit being stored in a register.

11. An electronic device comprising the driver according to claim 10.

12. An electronic device comprising the driver according to claim 7.

13. An electronic device comprising the driver according to claim 6.

14. An electronic device comprising the driver according to claim 1.

* * * * *